United States Patent
Luo et al.

(10) Patent No.: US 9,573,158 B2
(45) Date of Patent: Feb. 21, 2017

(54) HIGH MOBILITY POLYMER THIN-FILM TRANSISTORS WITH CAPILLARITY-MEDIATED SELF-ASSEMBLY

(71) Applicant: THE REGENTS OF UNIVERSITY OF CALIFORNIA, Oakland, CA (US)

(72) Inventors: Chan Luo, Santa Barbara, CA (US); Alan Heeger, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/585,653

(22) Filed: Dec. 30, 2014

(65) Prior Publication Data
US 2015/0194606 A1    Jul. 9, 2015

Related U.S. Application Data

(60) Provisional application No. 61/923,452, filed on Jan. 3, 2014.

(51) Int. Cl.
*B05C 9/02* (2006.01)
*H01L 51/00* (2006.01)

(52) U.S. Cl.
CPC ............ *B05C 9/02* (2013.01); *H01L 51/0012* (2013.01); *H01L 51/0036* (2013.01); *H01L 51/0043* (2013.01)

(58) Field of Classification Search
CPC .... B05C 9/02; H01L 51/0012; H01L 51/0043; H01L 51/0036
See application file for complete search history.

(56) References Cited

U.S. PATENT DOCUMENTS

| | | | | |
|---|---|---|---|---|
| 4,675,123 A | * | 6/1987 | Tsunooka | H01L 41/183 252/62.9 R |
| 6,060,338 A | * | 5/2000 | Tanaka | G02F 1/1368 257/40 |

(Continued)

FOREIGN PATENT DOCUMENTS

| | | |
|---|---|---|
| JP | H5-9308 | 1/1993 |
| WO | 2008/066458 | 6/2008 |
| WO | 2011/131280 | 10/2011 |

OTHER PUBLICATIONS

Ying et al., "Regioregular Pyridal[2, 1, 3]thiadiazole pi-Conjugated Copolymers," Journal of the American Chemical Society, vol. 133, iss. 46, pp. 18538-18541, 2011.

(Continued)

*Primary Examiner* — John P Dulka
(74) *Attorney, Agent, or Firm* — Gates & Cooper LLP

(57) ABSTRACT

Embodiments of the invention include methods and materials for preparing organic semiconducting layers, for example one used in an organic semiconductor device including a substrate with a nanostructured surface and a polymeric semiconductor film overlying the nanostructured surface. Aspects of the invention use capillary action to modulate polymer chain self-assembly on a surface and unidirectional alignment at a critical buried interface where charge carriers migrate between a dielectric and the polymer. By controlling the properties of the surfaces upon which polymers are disposed, artisans can enhance the transistor saturated mobilities of conjugated polymers.

21 Claims, 20 Drawing Sheets

(56) References Cited

U.S. PATENT DOCUMENTS

| | | | | |
|---|---|---|---|---|
| 9,293,708 B2* | 3/2016 | Bazan | ............... | C08G 61/122 |
| 2002/0193551 A1 | 12/2002 | Pei | | |
| 2004/0247814 A1* | 12/2004 | Sirringhaus | ......... | H01L 51/0012 |
| | | | | 428/64.1 |
| 2004/0253836 A1* | 12/2004 | Sirringhaus | ............ | B82Y 10/00 |
| | | | | 438/780 |
| 2007/0264748 A1* | 11/2007 | Sirringhaus | ......... | H01L 51/0012 |
| | | | | 438/99 |
| 2008/0248313 A1 | 10/2008 | Seshadri et al. | | |
| 2011/0168264 A1 | 7/2011 | Kastler et al. | | |
| 2011/0240973 A1 | 10/2011 | Dueggeli et al. | | |
| 2012/0322966 A1* | 12/2012 | Bazan | ............... | C08G 61/122 |
| | | | | 528/33 |
| 2015/0214486 A1* | 7/2015 | Tseng | ............... | H01L 51/0012 |
| | | | | 257/40 |

OTHER PUBLICATIONS

Tseng et al. "High Mobility Field Effect Transistors Based on Macroscopically Oriented, Regioregular Copolymers", Nano Letters, vol. 12, iss. 12, pp. 6353-6357, 2012.
PCT International Search Report and Written Opinion from PCT/US2013/058546 dated Aug. 18, 2014.

* cited by examiner

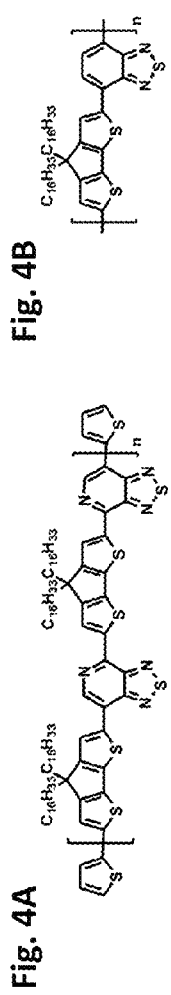
Fig. 4A
Fig. 4B
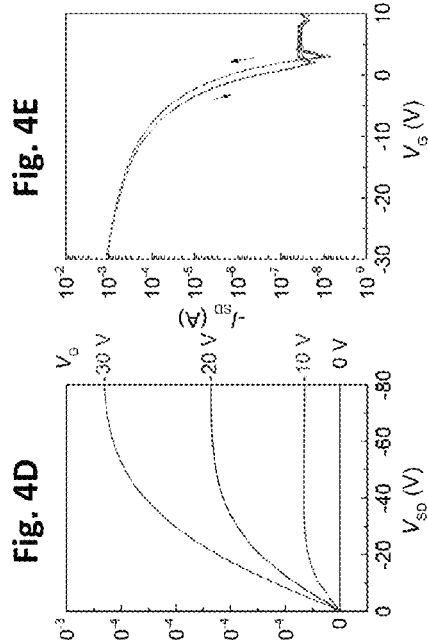
Fig. 4C
Fig. 4D
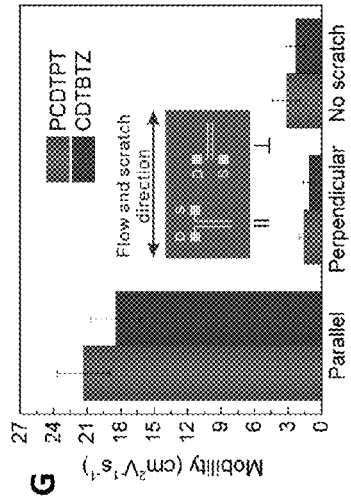
Fig. 4E
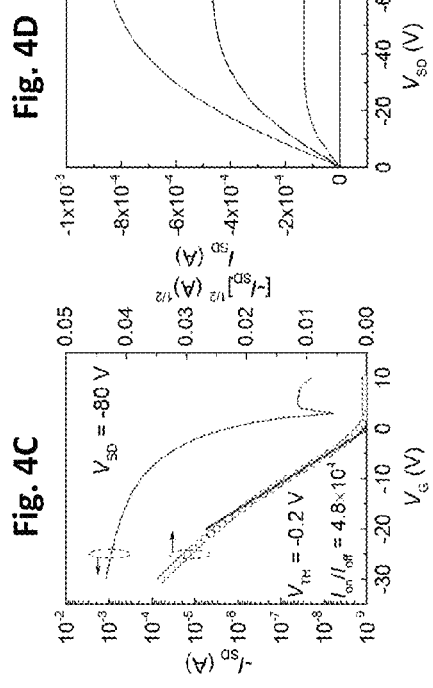
Fig. 4F
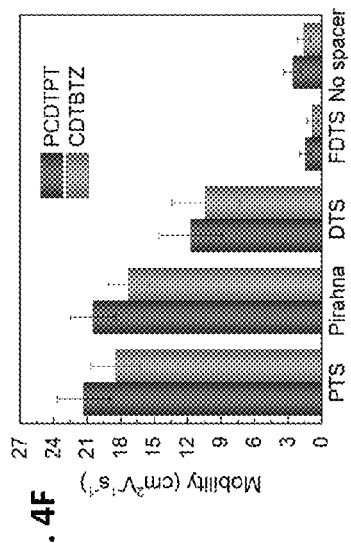
Fig. 4G

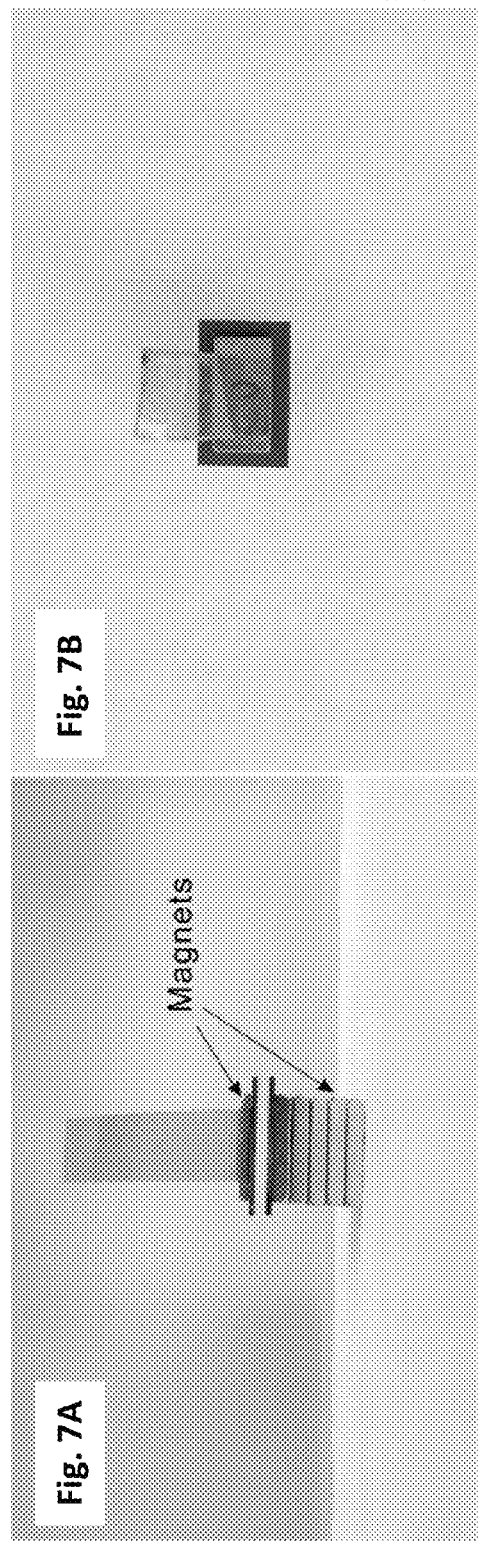

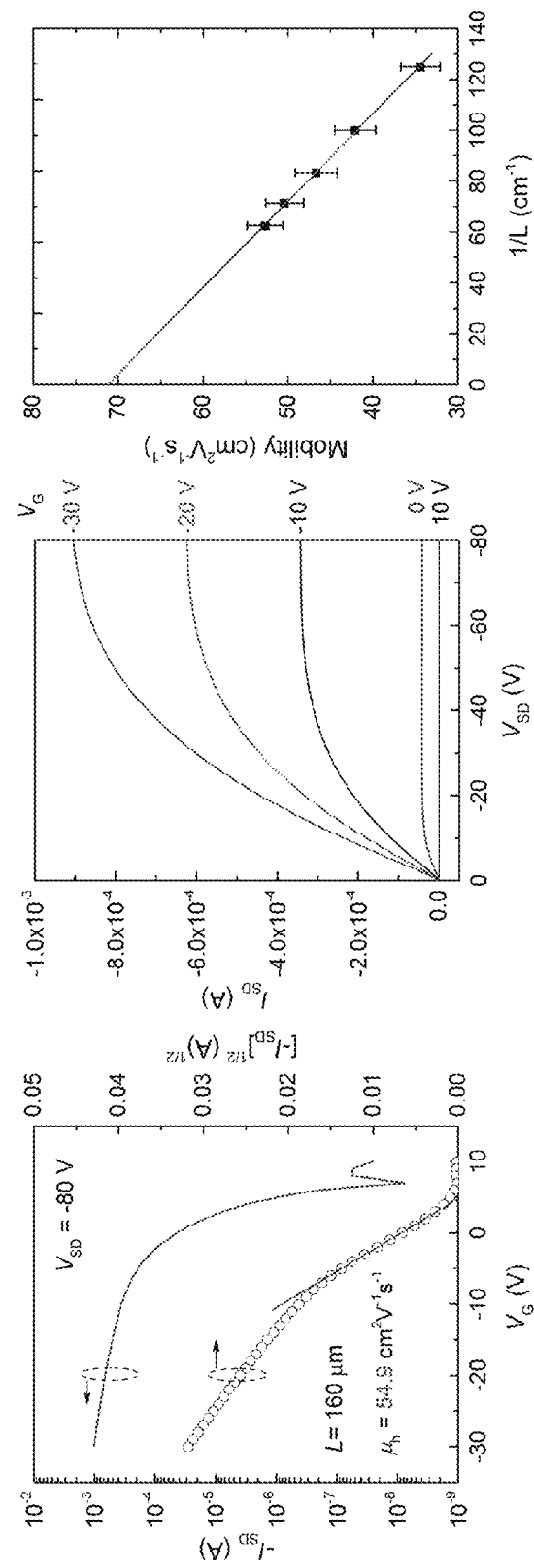

Best performance of dpp-p1 and dpp-p2 (aligned devices, same conditions)
Fig. 15A
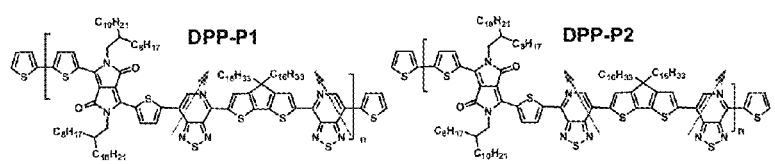
Fig. 15B DPP-P1 at 100°C, hole mobility $\mu = 6.7\ cm^2V^{-1}s^{-1}$
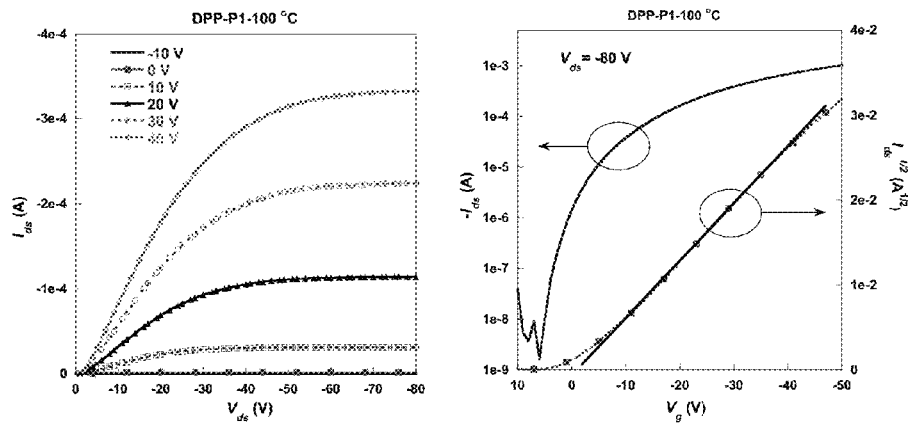
Fig. 15C DPP-P2 at 200°C, hole mobility: $\mu = 0.6\ cm^2V^{-1}s^{-1}$
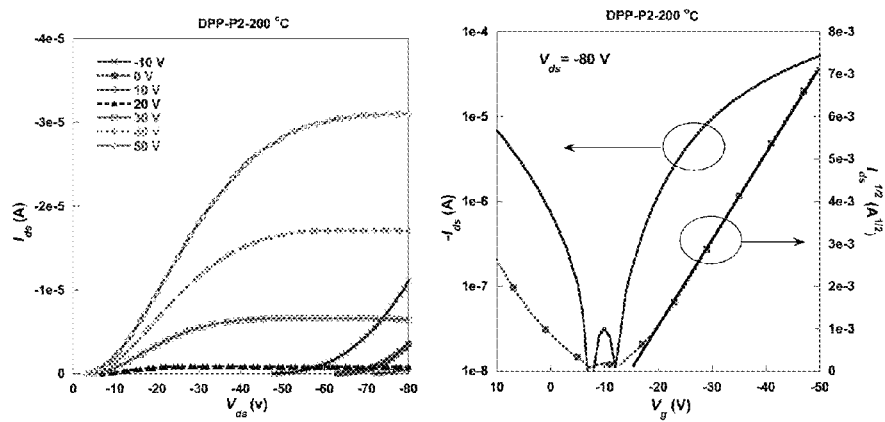

HIGH MOBILITY POLYMER THIN-FILM TRANSISTORS WITH CAPILLARITY-MEDIATED SELF-ASSEMBLY

REFERENCE TO RELATED APPLICATIONS

This application claims the benefit under 35 U.S.C. Section 119(e) of U.S. Provisional Patent Application Ser. No. 61/923,452, filed on Jan. 3, 2014, entitled "HIGH MOBILITY POLYMER THIN FILM TRANSISTORS WITH CAPILLARITY MEDIATED SELF-ASSEMBLY", the contents of which are incorporated herein by reference.

TECHNICAL FIELD

The invention relates to methods and materials useful in organic semiconductor devices.

BACKGROUND OF THE INVENTION

There is great interest in a new generation of electronic devices which use organic semiconductors as their active components, such as organic light-emitting transistors (OLETs) and organic photovoltaics (OPVs). In particular, there is interest in conjugated polymer based organic semiconductors because they combine the electrical properties of semiconductors with the mechanical properties of plastics. Furthermore, since these materials can be processed relatively inexpensively with techniques such as spin-coating and ink jet printing, conjugated polymers are finding increased applications in optoelectronic devices such as plastic light-emitting diodes (LEDs) and photovoltaic cells. With an ability to form active layers in these types of electronic devices, conjugated polymers provide promising materials for optimizing the performance of existing devices as well as the development of new devices.

Charge mobility is one of the most important factors in the performance of semiconducting polymers for use in thin-film transistors (TFTs) [1, 2] and photovoltaic cells [3-5]. The effort to boost the charge-carrier mobility of conjugated polymers has spanned over thirty years [33, 42-44]. Ideal semiconducting polymers must exhibit high mobility to be competitive in TFTs and photovoltaic cells, where rapid charge transport is crucial to device performance. In polymer light-emitting diodes [6-8], electrochemical cells [9], and biosensors [10], however, efficient light emission is the critical factor, but charge transport is also essential. Due to the high degree of conformational freedom of macromolecular chains and the irregular interchain entanglement, polymers tend to form disordered structures at nanometer to micrometer length scales. This disorder impedes charge transport. High charge mobility can only be obtained when the polymer chains align in a linear configuration favorable for charge delocalization along the conjugated backbone. In order to allow efficient long-range transport within a polymer film, microscopic molecular packing and macroscopic anisotropic alignment must be created.

A great deal of effort has been devoted to designing new materials in order to induce anisotropic alignment of polymer chains by strengthening intermolecular interactions, such as hydrogen bonding [11], sulphur-fluorine interactions [2], and π-π stacking [12, 13]. So far, however, semiconducting polymers have not been demonstrated to self-assemble into large-scale, ordered structures. There have been many attempts to improve charge transport mobility through material processing, such as the application of shear force with the use of doctor blading [14], dip coating [15], strain stretching [16], Langmuir-Blodgett deposition [17], and topographical patterning [18]. Although these processing methods have demonstrated progress toward molecular assembly and chain alignment, the measured TFT mobilities have remained insufficient for most applications (typically less than 3 $cm^2V^{-1} s^{-1}$) [2, 15, 18].

There is no solution-based processing technology that is capable of creating semiconducting polymer thin-films showing self-assembly of aligned nanocrystalline domains with charge transport mobilities comparable to values obtained in inorganic semiconductors. A strategy to macroscopically self-assemble semiconducting polymers and thereby harness their unique potential for anisotropic charge transport is needed for enhancing their performance and accelerating their applications in technologies such as optoelectronics.

SUMMARY OF THE INVENTION

Solution processable semiconducting polymers with excellent film forming capacity and mechanical flexibility are considered among the most progressive alternatives to conventional inorganic semiconductors. However, the random packing of polymer chains and the disorder of the polymer matrix typically result in low charge transport mobilities ($10^{-5}$ to $10^{-2}$ $cm^2V^{-1} s^{-1}$). These low mobilities compromise their performance and development. The present invention provides systems and methods—by utilizing capillary action—to mediate polymer chain self-assembly and unidirectional alignment on nano-grooved substrates.

Embodiments of the invention include methods of using the capillary action of solutions to align a plurality of polymer fibers. In these methods, surfaces of substrates and spacers are treated in a manner that modulates the capillary action of a solution contacting the treated surface(s). The solution is then evaporated so as to produce a plurality of aligned polymer fibers. Embodiments of the invention also include systems designed to use capillary action to align a plurality of polymer fibers. Typically these systems comprise a substrate, a spacer, and a solution comprising polymers. In one or more embodiments, the system comprises a first substrate; a first spacer; a second spacer; a second substrate; and a solution comprising polymers. In such embodiments, the second substrate is disposed on top of the first and second spacers so as to form a sandwich tunnel structure. In these systems, at least one surface of the substrate and/or spacer has been treated so as to modulate the capillary action of the solution contacting the substrate and/or spacer. In addition, in such systems, the substrate can be texturized in order to comprise a plurality of indentations that contact and align the plurality of polymer fibers. As shown in the Examples below, these methods and systems can be used to modulate the charge transport mobilities of polymer fiber compositions in a manner that enhances the performance of devices designed to include such compositions.

In one or more embodiments of the invention, surfaces of substrates and/or spacers are treated, for example by coating the surface with a silane composition in a manner that changes the interaction of the polymer solution with the surface. Optionally, for example, a surface is treated so that the contact angle of the solution on the surface is less than or equal to 10°. In one working embodiment of the invention two substrates in a sandwich structure are treated identically with a layer of self-assembled silane such as n-decyltrichlorosilane (DTS), in order to eliminate the surface charge traps. In such embodiments, the spacers inserted in the sandwich structure are formed from a material (or coated with a material) selected for an ability to attract (or repel) the polymer solution to modulate polymer fiber alignment on the two (top and bottom) texturized substrates. In certain embodiments, top and bottom substrates are treated with the same silane, while a spacer is treated differently (e.g. with different silanes) to control the attraction or repulsion effects of the solution in the sandwich tunnel structure. As discussed below, surfaces can be treated with compounds such as organosilanes in order to eliminate the charge trapping groups, such as hydroxyl group, on a dielectric layer (e.g. one comprising silicon dioxide) through the chemical reaction between chlorosilanes and hydroxyl groups. In these embodiments, the field effect saturation mobility increases after the treatment to the substrate or spacer, due to decreased traps on the substrate or spacer.

Embodiments of the invention use gravity to modulate the flow of a solution contacting substrate and spacers. For example, in one or more embodiments of the invention, a substrate (e.g. one forming a sandwich tunnel structure) is tilted so that gravity modulates the flow of a solution over the substrate. Typically, the tilting angel does not exceed 15°. In certain instances, the tilting angle is between 11° and 13° (e.g. is 12.5°). In certain embodiments, the method uses gravity to facilitate the flow of the solution towards a spacer treated so as to attract the solution. In addition, the evaporation rate of the solution can be controlled in a manner that facilitates polymer fiber alignment. In some instances, the evaporation rate is controlled so as to be not more than 0.25 µL/min. In other instances, the evaporation rate is controlled so as to be not more than $4 \times 10^{-3}$ µLmin$^{-1}$ mm$^{-2}$. As discussed below, these processes can be used to modulate (e.g. enhance) the charge transport mobilities of polymer fiber compositions in devices designed to include such compositions.

In illustrative embodiments the invention, the polymer fibers are formed from conjugated polymers comprising a plurality donor and acceptor units. The conjugated polymers are disposed in the fibers such that longitudinal axes of the conjugated polymers within the polymer fibers are substantially aligned along longitudinal axes of the polymer fibers. The plurality of directionally aligned polymer fibers are adapted to transport charge between source and drain electrodes in a field effect transistor such that the field effect saturation mobility of the plurality of directionally aligned polymer fibers in the field effect transistor is at least 25 cm$^2$/Vs. In one or more embodiments, the field effect saturation mobility of the plurality of directionally aligned polymer fibers is at least 25, 36, 47, 52, 54 or 71 cm$^2$/Vs. Optionally, the conjugated polymers comprise regioregular polymers having a regioregular conjugated main chain section, said regioregular conjugated main chain section having a repeat unit that comprises a pyridine of the structure:

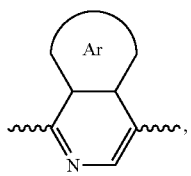

wherein Ar is a substituted or non-substituted aromatic functional group, or Ar is nothing and the valence of the pyridine ring is completed with hydrogen; and the pyridine is regioregularly arranged along the conjugated main chain section. In some embodiments of the invention, the conjugated polymers comprise a repeat unit that comprises of the following structure:

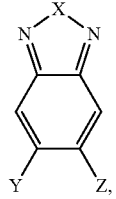

wherein X is O, S, Se, or N—R where R is H or a substituted or non-substituted alkyl, aryl or alkoxy chain; and Y and Z are independently selected to be H or F. The substituted or non-substituted alkyl, aryl or alkoxy chain can be a $C_6$-$C_{30}$ substituted or non-substituted alkyl or alkoxy chain, —(CH$_2$CH$_2$O)n (n=2~20), $C_6H_5$, —$C_nF_{(2n+1)}$ (n=2~20), —(CH$_2$)$_n$N(CH$_3$)$_3$Br (n=2~20), 2-ethylhexyl, PhC$_m$H$_{2m+1}$ (m=1-20), —(CH$_2$)$_n$N(C$_2$H$_5$)$_2$ (n=2~20), —(CH$_2$)$_n$Si (C$_m$H$_{2m+1}$)$_3$ (m, n=1 to 20), or —(CH$_2$)$_n$Si(OSi(C$_m$H$_{2m+1}$)$_3$)$_x$(C$_p$H$_{2p+1}$)$_y$ (m, n, p=1 to 20, x+y=3). In particular embodiments, R is $C_{12}H_{25}$, $C_{16}H_{33}$, 2-ethylhexyl, or PhC$_6H_{13}$.

Other objects, features and advantages of the present invention will become apparent to those skilled in the art from the following detailed description. It is to be understood, however, that the detailed description and specific examples, while indicating some embodiments of the present invention are given by way of illustration and not limitation. Many changes and modifications within the scope of the present invention may be made without departing from the spirit thereof, and the invention includes all such modifications.

BRIEF DESCRIPTION OF THE DRAWINGS

For a more complete understanding of the present invention, reference is now made to the following descriptions taken in conjunction with the accompanying drawings, in which:

FIG. 1A is a schematic illustration of an embodiment of a sandwich tunnel system consisting of two substrates with a pair of glass spacers inserted at two ends. Polymer solution is added into the tunnel. "D" and "S" denote a bottom-contact drain and source electrode, respectively. FIG. 1B shows illustrative capillary height tests on a polymer solution prepared in chlorobenzene using glass capillary tubes (inner diameter: ca. 1.2 mm) with various surface treatments. Tube 1 is treated by perfluorodecyltrichlorosilane (FDTS); tube 2 is treated by DTS; tube 3 is treated by piranha solution; and tube 4 is treated by phenyltrichlorosilane (PTS). FIG. 1C is a graph summarizing the contact angle measurements on the plain glass slides with the four different treatments using water and chlorobenzene as the testing media, respectively. FIG. 1D is a schematic diagram (side view) showing the different actions to the polymer solution exerted by the spacers with two opposite surface treatments, PTS (top) and FDTS (bottom), respectively.

FIG. 2C shows a 3D AFM image of the topography, demonstrating the unidirectional orientation in a large domain. FIG. 2D is a section analysis of a height profile traced along the direction perpendicular to the alignment indicates the nano-groove/ridge features corresponding to the nanostructure on the textured Si/SiO$_2$ substrate (see also FIG. 8). The two markers on the height profile indicate the two points marked in FIG. 2B.

FIG. 3E is a model of one embodiment, showing the preferential molecular orientations along the nano-groove on the textured substrate, and the calculated spacing between individual planes.

FIGS. 4A-G show comparisons of transistor characteristics from two semiconducting polymers, prepared by different surface treatments over the spacers, and the anisotropic charge transport, in accordance with one or more embodiments of the present invention. The molecular structures of PCDTPT and CDTBTZ are shown in (FIG. 4A) and (FIG. 4B), respectively. Transfer (FIG. 4C) and output (FIG. 4D) characteristics of a representative device show the saturation mobility of 25.4 cm$^2$V$^{-1}$ s$^{-1}$ measured at the transistor channel length (L=80 μm), fabricated from PCDTPT by treating the pair of spacers with PTS. FIG. 4E shows a hysteresis characterization with four cycles of sweeping of gate-source voltage. FIG. 4F is a graph comparing the average saturation mobility of the devices (L=80 μm) prepared from PCDTPT and CDTBTZ with various surface treatments over the pair of spacers. The S-D orientation of all devices is parallel to the solution flow drawn by capillary action and the nanogrooves on the textured substrate. FIG. 4G is a graph showing the dependence of average saturation mobility on the S-D orientation. All devices are obtained from spacers using PTS treatment. The inset in FIG. 4G is a schematic diagram showing parallel and perpendicular orientations of S-D relative to the direction of solution flow and nano-groove orientation. The average saturation mobility with standard deviation in each processing condition was obtained from 20 devices close to the low-lying spacer (distance: ca. 0.5 mm). The error bars denote the 5$^{th}$ and 95$^{th}$ percentile values and the bar heights show the average values.

FIG. 6A is an illustration (side view) of tilting the tunnel system during solution drying. FIG. 6B is a set of optical images (1-8, top view) showing the consecutive drying process of polymer solution, trapped in the tunnel system and tilted at 12.5° in ambient conditions. The pair of spacers at two sides (low- and high-lying) were treated by PTS. For clear observation, a sheet of transparent glass was used as the cover substrate, together with a fine metal needle (top) and magnets (bottom) stabilizing the whole system. FIG. 6C is a graph comparing the average saturation mobility as function of the tilting angle applied to the tunnel system with two opposite treatments, PTS and FDTS, over the pair of spacers. The data were obtained from 8 devices (L=80 μm), for each tilting angle, close to the low-lying spacer (distance: ca. 0.5 mm). FIG. 6D is a graph showing the average saturation mobility of devices (L=80 μm) depending on the distance relative to the low-lying spacer. Four combinations of surface treatments to the pair of spacers were compared for the tilted tunnel system (12.5°). For example, PTS-FDTS represents PTS treatment was applied to the low-lying spacer while FDTS treatment to the high-lying spacer. The mobility data were collected from 8 devices for each position relative to the low-lying spacer. The average is given without standard deviation for clarity.

FIGS. 7A-B show the side (FIG. 7A) and top (FIG. 7B) views of a sandwich tunnel structure constructed by magnets, in accordance with one or more embodiments of the present invention.

FIG. 8A is a topography image of the nanostructure generated on the texturized substrate. The scale bar represents the length of 200 nm. The diamond nanoparticles with average diameter of ca. 100 nm are used to scratch the substrate. The RMS roughness of the image is 1.57 nm. FIG. 8B is a section analysis of height profile obtained from the blue cut line in FIG. 8A.

FIGS. 14A-C show the transfer (FIG. 14A) and output (FIG. 14B) characteristics of a representative device, showing the saturation mobility of 54.9 $cm^2V^{-1} s^{-1}$ measured at the transistor channel length of 160 μm, fabricated from PCDTPT ($M_n$=50 kDa), in accordance with one or more embodiments of the present invention. FIG. 14C is a graph showing the channel length related average saturation mobility of PCDTBT ($M_n$=50 kDa). The average and error bars were obtained from the results of 8 devices. The extrapolation to infinite channel length shows the intrinsic mobility of ca. 71 $cm^2V^{-1} s^{-1}$. All the devices are fabricated from PTS-treated spacers.

FIGS. 15A-C show the molecular structures (FIG. 15A) and transfer characteristics of TFT devices with copolymers DPP-P1 (FIG. 15B) and DPP-P2 (FIG. 15C), in accordance with one or more embodiments of the present invention. Synthesis of DPP-P1 and DPP-P2 polymers has been described, for example, in International Patent Application No. PCT/US2013/058546, where the devices were tested at room temperature after being annealed at 100° C. and 200° C.

DETAILED DESCRIPTION OF THE INVENTION

Figure 1B:
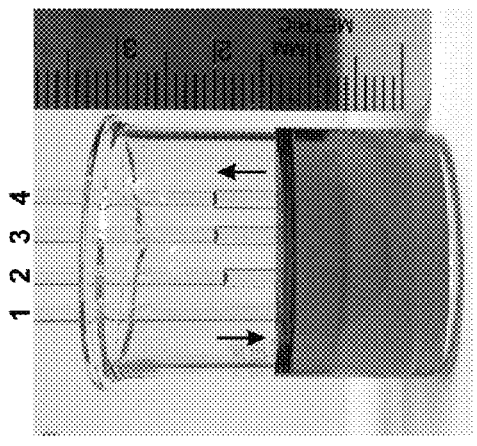
FIGS. 1A-D illustrate capillary action generated by subjecting the glass spacers to different surface treatments, in accordance with one or more embodiments of the present invention.

Unless otherwise defined, all terms of art, notations and other scientific terms or terminology used herein are intended to have the meanings commonly understood by those of skill in the art to which this invention pertains. Many of the techniques and procedures described or referenced herein are well understood and commonly employed using conventional methodology by those skilled in the art. In the description of illustrative embodiments, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Initial progress towards creating self-assembled and aligned semiconducting polymer thin-films was reported with the use of nano-grooved substrates to obtain chain alignment with a resulting thin film hole mobility of $\mu_h \approx 20$ $cm^2V^{-1} s^{-1}$ [19, 20]. Although promising, the present invention provides even higher mobilities and a general system and method for achieving such high mobilities. Generally, the system and method for self-assembly of semiconducting polymer films uses capillary action in a sandwich casting system to generate macroscopically aligned nanostructures with high transport mobility, for example, for the gate-induced charges in bottom-gate thin-film transistors (TFTs).

As demonstrated in illustrative experiments (see Example section below), a general and effective strategy is provided to create unidirectional alignment and efficient charge transport for semiconducting polymer films deposited on textured substrates. By employing sandwich casting in a tilted tunnel system, capillary action generated by the functionalized spacer is effectively utilized to render self-assembly of the semiconducting polymer along the uniaxial nano-grooves on the substrate. The strength of capillary action can be readily tailored by different surface treatments and functionalizations over the glass spacers. Charge transport in the polymer films prepared by this method is sensitive to the strength of capillary action induced by the functionalized spacers. The capillary action from phenyltrichlorosilane (PTS) functionalization enables the achievement of highly oriented crystalline films with a compact lamella structure. These values are limited by the source-to-drain (S-D) contact resistance, $R_c$. The charge transport in the aligned films exhibits strong anisotropy, showing higher mobility along the direction of alignment than perpendicular to the alignment for the two polymers, respectively. This methodology may be applied to a board range of semiconducting polymers. The concept of capillarity-mediated self-assembly and alignment opens up the possibility of enhancing anisotropic charge transport to create high mobility solution processable TFTs for low-cost organic electronics.

The invention disclosed herein has a number of aspects and embodiments. Embodiments of the invention include methods of using the capillary action to form a composition comprising a plurality of aligned polymer fibers. Typically, these methods comprise depositing a solution comprising polymers onto a first substrate (and typically at least two substrates) coupled to a spacer (and typically at least two spacers). In these methods, a surface of the first substrate and/or the second substrate and/or the first spacer and/or the second spacer is selected for an ability to modulate the capillary action of the solution contacting the substrates and spacers. In some embodiments of the invention, the substrate and/or the spacer is formed from a material selected for an ability to modulate the capillary action of the solution contacting substrates and spacers. The substrate and/or the spacer can also be coated with a material selected for an ability to modulate the capillary action of the solution contacting substrates and spacers. Capillary action is then used to modulate the flow of the solution contacting the selected surface(s). The solution is then evaporated so as to produce a composition comprising a plurality of aligned polymer fibers.

Another embodiment of the invention is system that is designed to use capillary action to form a composition comprising a plurality of aligned polymer fibers. Typically these systems comprise a substrate, a spacer, and a solution comprising polymers. In one or more embodiments, the system comprises a first substrate and a second substrate disposed on top of a first and second spacer so as to form a sandwich tunnel structure. In such systems, at least one surface of the substrate and/or spacer has been treated so as to modulate the capillary action of the solution contacting the substrate and/or spacer. In addition, in such systems, the substrate can be texturized in order to comprise a plurality of indentations that contact and align the plurality of polymer fibers. Typically, the plurality of indentations is disposed in a direction that is perpendicular to a spacer.

In embodiments of the invention, surfaces of substrate and spacers are treated, for example by coating the surface with a silane composition in a manner that changes the affinity of the surface for polymer solution. Optionally, for example, a surface is treated so that the contact angle of the solution on the surface is less than or equal to 10°. In one working embodiment of the invention two substrates in a sandwich structure are treated identically with a layer of self-assembled silane such as DTS (n-decyltrichlorosilane), in order to eliminate the surface charge traps. In such embodiments, the spacers inserted in the sandwich structure are formed from a material (or coated with a material) selected for an ability to attract (or repel) the polymer solution to modulate polymer fiber alignment on the two (top and bottom) texturized substrates. In certain embodiments, top and bottom substrates are treated with the same silane, while a spacer is treated differently (e.g. with different silanes) to control the attraction or repulsion effects of the solution in the sandwich tunnel structure. As discussed below, surfaces can be treated with compounds such as organosilanes in order to eliminate the charge trapping groups, such as hydroxyl group, on a dielectric layer (e.g. one comprising silicon dioxide) through the chemical reaction between chlorosilanes and hydroxyl groups. In these embodiments, the field effect saturation mobility increases after the treatment to the substrate or spacer, due to decreased traps on the substrate or spacer.

Embodiments of the invention can use gravity to modulate the flow of a solution contacting substrate and spacers. For example, in embodiments of the invention, a substrate (e.g. one forming a sandwich tunnel structure) is tilted so that gravity modulates the flow of a solution over the substrate. In typical embodiments of the tilting angle does not exceed 15°. Typically, the tilting angel does not exceed 15°. In common embodiments, the tilting angle is between 11° and 13° (e.g. is 12.5°). In certain embodiments, the method uses gravity to facilitate the flow of the solution towards a spacer treated so as to attract the solution. In addition, the evaporation rate of the solution can be controlled in a manner that facilitates polymer fiber alignment. In some embodiments of the invention, the evaporation rate is controlled so as to be not more than $4 \times 10^{-3}$ μL min$^{-1}$ mm$^{-2}$.

Figure 1D:
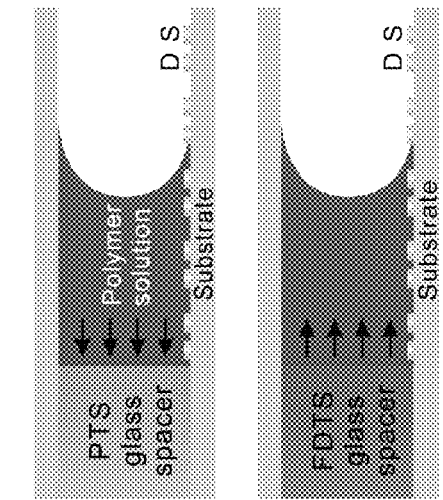
Figure 1A:
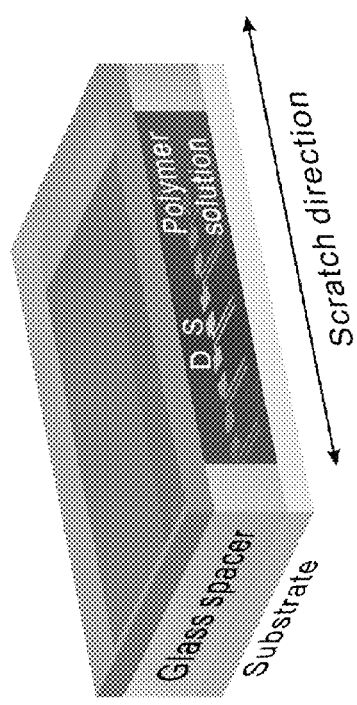
Figure 8A:
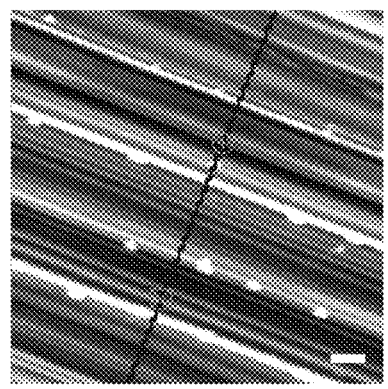
FIGS. 8A-B show an AFM topography image and a height profile of uniaxially scratched nanostructures on a substrate, in accordance with one or more embodiments of the present invention.
Figure 8B:
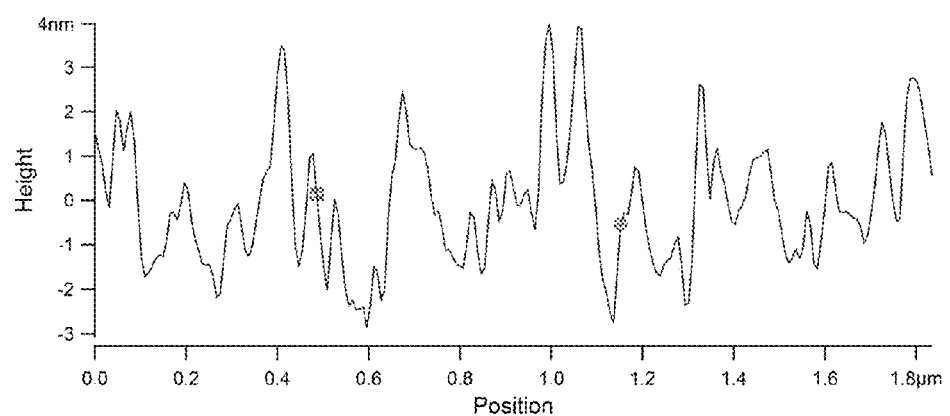
Figure 9C:
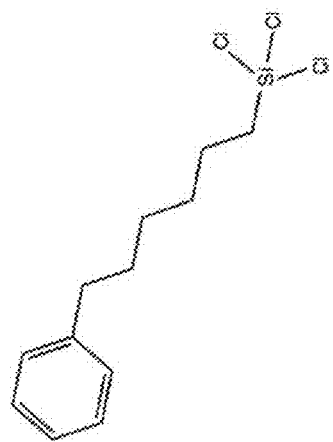
FIGS. 9A-C show the molecular structures of organosilanes FDTS (FIG. 9A), DTS (FIG. 9B), and PTS (FIG. 9C), used in the treatment to the spacers, in accordance with one or more embodiments of the present invention.
Figure 9B:
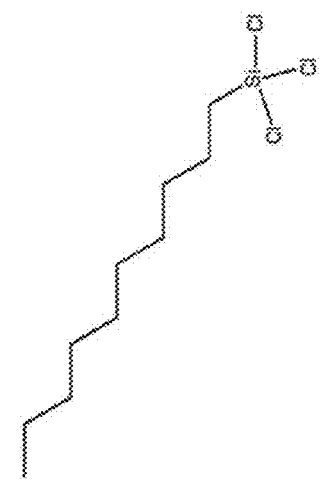
Figure 9A:
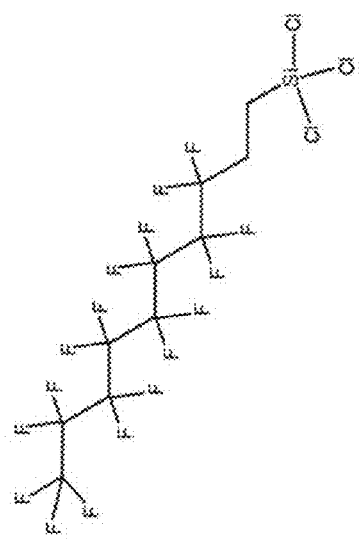

In one illustrative embodiment, as shown in FIG. 1A, the sandwich casting system is comprised of two substrates (for example Si/SiO$_2$), separated by two glass spacers on both short sides. The polymer solution is easily trapped in the tunnel by surface tension, even if the system is slightly tilted along the longitudinal direction. Capillary-mediated film deposition is then achieved through slow solvent drying. In one instance, for an amount of 75 μL dilute polymer solution (0.25 mg ml$^{-1}$) prepared in chlorobenzene, 5 hours are required for solvent evaporation in a closed petri dish at room temperature under N$_2$ atmosphere. In general, a slow film forming process facilitates disentanglement of the macromolecules and self-assembly into crystalline nanostructures [21-23]. Aligning semiconducting polymers with highly parallel spatial orientation is still a formidable challenge, due to the lack of external directional guidance to the complex macromolecules with multiple degrees of conformational freedom. Here, the capillary action, generated by the glass spacers, is utilized to promote polymer chain self-alignment along uniaxial nano-grooves on a textured substrate (FIGS. 8A-B). The strength of the capillary action can be readily tailored by surface treatment and functionalization with self-assembled monolayers (SAMs) of selected organosilanes, such as perfluorodecyltrichlorosilane (FDTS), n-decyltrichlorosilane (DTS) and 6-phenylhexyl-trichlorosilane (PTS) (see FIGS. 9A-C for the relevant molecular structures).

The drawing effect of capillary action on the guided alignment is schematically illustrated in FIG. 1D. Because of the surface attraction and capillary action generated by treatment with, for example PTS, the solution is drawn and flows toward the spacer. The flow direction is parallel to the uniaxial nano-grooves on the textured substrate and is thus favorable for polymer alignment during solution drying. On the other hand, the surface repulsion caused by treatment with, for example FDTS, suppresses such flow toward the spacer; a situation unfavorable to polymer alignment along the uniaxial nano-grooves.

Illustrative embodiments of the invention include organic semiconductor devices as well as methods and materials for making and using such devices. The device embodiments of the invention typically include a substrate having a nanostructured surface, and an organic semiconductor film overlying the nanostructured surface. In certain devices embodiments, the substrate can be passivated and can include a dielectric layer which includes the nanostructured surface. The organic semiconductor film of the device can be an ordered organic semiconductor film, which in turn can comprise a semiconducting polymer. The semiconducting polymer can form polymer fibers, which can be macroscopically oriented. The device can be an organic field-effect transistor, a light-emitting transistor, or an organic solar cell.

In addition to the capillary methods discussed above, embodiments of the invention include compositions of matter formed from conjugated polymers and having specific molecular architectures. Illustrative embodiments include, for example, a composition of matter comprising a bundle of polymer fibers, with the polymer fibers in the bundle formed from conjugated polymers comprising a plurality donor and acceptor units. In such compositions, the conjugated polymers are arranged in the fibers so that longitudinal axes of the conjugated polymers within the polymer fibers are substantially aligned along longitudinal axes of the polymer fibers. In addition, in these compositions, a plurality of the polymer fibers in the bundle are disposed in a non random orientation such that the plurality of polymer fibers are directionally aligned. In illustrative working embodiments of the invention, the composition forms an organic semiconductor film where the plurality of directionally aligned polymer fibers are adapted to carry electrons in a field effect transistor, and the field effect saturation mobility of the plurality of directionally aligned polymer fibers in this field effect transistor is at least 25 cm$^2$/Vs. In specific embodiments, the field effect saturation mobility of the plurality of directionally aligned polymer fibers is at least 25, 36, 47, 52, 54 or 71 cm$^2$/Vs.

Related embodiments of the invention include electronic devices and systems designed to include the aligned polymer fiber compositions that are disclosed herein. Embodiments of the invention include methods of modulating the field effect saturation mobility of a plurality of polymer fibers disposed within an active layer of a device such as an optoelectronic device by using capillary action to align a plurality of polymer fibers so as to control the orientation of the fibers in the device. Typically these methods comprise forming the active layer in the device by depositing a solution comprising polymers onto a first substrate in a manner that modulates the capillary action of the solution contacting the first substrate and/or spacer, allowing capillary action to modulate the flow of the solution contacting the first substrate and/or spacer, and then evaporating the solution so that the plurality of polymer fibers are aligned. Illustrative embodiments of the invention include devices such as field effect transistors having the axially aligned polymer fiber compositions disposed between and in operable contact with the FET source and drain electrodes. In such FETs, electrodes are in electronic contact via the plurality of polymer fibers aligned along a directional axis from a first electrode to a second electrode so as to form an electric circuit. In one or more embodiments of the invention, the field effect saturation mobility of the plurality of aligned polymer fibers in the FET can exhibit a field effect saturation mobility of at least 25 $cm^2/Vs$. In specific embodiments, the field effect saturation mobility of the plurality of directionally aligned polymer fibers is at least 25, 36, 47, 52, 54 or 71 $cm^2/Vs$.

An exemplary semiconducting field effect transistor (FET) that utilizes the conjugated polymer compositions disclosed herein comprises a source electrode, a drain electrode, a gate electrode and an electronically insulating layer of material forming a gate electrode dielectric. In such embodiments of the invention, the polymer fiber composition comprises a bundle of polymer fibers including a plurality of polymer fibers aligned along a directional axis from a first electrode to a second electrode. In addition, in these FET embodiments, the polymer fibers are formed from conjugated polymers disposed in the fibers such that longitudinal axes of the conjugated polymers within the polymer fibers are substantially aligned along longitudinal axes of the polymer fibers, and the electrodes are operably coupled to the polymer composition so that the plurality of aligned polymer fibers exhibit a field effect saturation mobility of at least 10 $cm^2/Vs$.

In typical embodiments of the invention, a polymer fiber composition used in the FET forms an organic semiconductor film and is disposed on a substrate having a nanostructured surface, wherein the substrate comprises an insulating gate dielectric in direct contact with the conducting gate material of the FET. In illustrative embodiments of the invention, the nanostructured surface comprises a plurality of grooves that contact and align the plurality of polymer fibers. In certain embodiments of the invention, at least one dimension of nanostructures between adjacent grooves ranges from about 20 nm to about 200 nm. As discussed below, embodiments of the invention further comprise a plurality of semiconducting field effect transistors that comprise a polymeric composition of the invention and which are further combined together in an array.

In embodiments of the invention, the surface of a base/substrate upon which the polymer fibers are aligned is chemically treated in order to introduce functional chemical groups that can facilitate fiber alignment by modifying the water contact angle of the surface, or by increasing hydrophobicity of the surface, or decreasing the hydrophobicity of the surface etc. Embodiments of the invention can, for example, modify the surface to introduce polar functional groups such as ether, ester, carbonyl, carboxyl, and hydroxyl groups. Optionally the surface is modified using a compound that comprises a self-assembled monolayer (e.g. a fluorinated chlorosilane). In embodiments of the invention, the surface can be functionalized with a compound selected for its ability to, for example, attract the side chains of the polymer towards the interface (or, alternatively repel them away from the interface) in order to promote alignment relative to the substrate. In an illustrative embodiment of the invention, the surface is treated with a piranha solution, also known as piranha etch, a mixture of sulfuric acid ($H_2SO_4$) and hydrogen peroxide ($H_2O_2$), which used to clean organic residues off substrates. Because the piranha solution, mixture is a strong oxidizing agent, it will remove most organic matter, and it will also hydroxylate most surfaces (add OH groups). In some embodiments of the invention, the surface is treated with at least one of a perfluorodecyltrichlorosilane (FDTS), a decyltrichlorosilane (DTS), a Piranha solution and/or a phenyltrichlorosilane (PTS).

Polymer layers may be deposited on a surface by a number of methods such as inkjet printing, bar coating, spin coating, blade coating and the like, thin film deposition technique such as spin coating, spray coating, bar coating, roll coating, blade coating, dip coating, free span coating, dye coating, screen printing, or ink jet printing. As noted below, embodiments of the invention can, for example, use inkjet printing to form partially or fully treated surfaces wherein the differences in the surface treatments (e.g. that result in surfaces having different surface energies) in order form barrier regions that confine the polymeric compositions.

Embodiments of the invention include devices having a plurality of different surfaces coated with a plurality of different polymers. Embodiments include a method for forming an electronic device comprising: defining on a substrate a first and a second region separated by a third region having a lower surface energy than the first and second regions; depositing a first polymer from solution onto the substrate in such a way that the deposition of the first polymer is confined to the first and second regions; and depositing a second polymer from solution onto the substrate in such a way that the deposition of the second polymer is confined to the third region. The method may comprise the additional step of treating the substrate after the deposition of the first polymer and prior to the deposition of the second polymer as to reduce the surface energy of the first polymer layer and/or enhance the surface energy of the third region. The electronic device may be a field-effect transistor having source and drain electrodes and a semiconducting layer, the first polymer in the first and second regions forming the source and drain electrodes respectively, and the second polymer in the third region forming the semiconducting layer. The first and second polymers may be deposited in the form of layers, which are in intimate contact with each other at the boundary of the third region with the first and second region.

In typical embodiments of the invention, the organic semiconductor solution is in contact with a nanostructured surface. In some embodiments of the methods, the organic semiconductor film can be an ordered organic semiconductor film, which in turn can include a semiconducting polymer. The semiconducting polymer can be in the form of polymer fibers, which can be macroscopically oriented. The substrate of the methods can be passivated and can include a dielectric layer which includes the nanostructured surface. The nanostructured surface can include nanostructures defined by nanoscale grooves between the nanostructures. In some embodiments of the methods, the height of the nanostructures ranges from about 0.5 nm to about 5 nm, or at least one dimension of the nanostructures between adjacent nanoscale grooves ranges from about 20 nm to about 200 nm, or a combination thereof.

In the methods, drying can include directionally drying the film or organic semiconductor solution by a process that includes the evaporation of a solvent of the organic semiconductor solution from two opposing regions of the solution. Also, the nanostructured surface can define at least part of a chamber in which the organic semiconductor solution resides, and directionally drying can include evaporating a solvent of the organic semiconductor solution from two opposing openings in the chamber. In some embodiments, the evaporating occurs predominantly or solely from the two opposing regions of the solution or the two opposing openings in the chamber. The methods can further include annealing the organic semiconductor film after the drying.

Embodiments of the invention can utilize a variety of conjugated polymer compositions. Embodiments of the invention can use alternating donor-acceptor (D-A) polymers. Mobility improvements have been reported due to better intermolecular packing based on (E)-2-(2-(thiophene-2-yl)vinyl)thiophene donor and the highly coplanar diketopyrrolopyrole (DPP) acceptor (see, e.g. [54]). Studies have also shown that with elevated molecular weight of poly[2,6-(4,4-bis-alkyl-4H-cyclopenta-[2,1-b;3,4-b']-dithiophene)-alt-4,7-(2,1,3-benzothiadiazole)] D-A based copolymer led to increase macroscopic order, and the hole mobility can be improved to values as high as 3.3 cm$^2$/Vs (see, e.g. [13]). In addition, regioregular versions of D-A based copolymer, poly[4-(4,4-dihexadecyl-4H-cyclopenta[1,2-b:5,4-b']dithiophen-2-yl)-alt-[1,2,5]thia diazolo[3,4-c]pyridine] (PCDTPT), exhibit close to two orders of magnitude larger hole mobilities compared to the regiorandom counterpart (see, e.g. [27] and [55]). In some embodiments of the invention, D-A polymers can be a poly[4-(4,4-dihexadecyl-4H-cyclopenta[1,2-b:5,4-b']dithiophen-2-yl)-6-fluorobenzo[c][1,2,5]thiadiazole] (PCDTFBT) as described in Example 3 of International Patent Application No. PCT/US2013/058546. In some embodiments of the invention, D-A polymers having a ratio of about one donor unit to one acceptor unit are used. In other embodiments of the invention, D-A polymers having a ratio of more than one donor unit to one acceptor unit are used. In other embodiments, D-A polymers having a ratio of less than one donor unit to one acceptor unit are used.

In some embodiments of the invention the composition comprises a regioregular conjugated main chain section having 5-100, or more, contiguous repeat units. In some embodiments, the number of repeat units is in the range of 10-40 repeats. The regioregularity of the conjugated main chain section can be 95% or greater. Exemplary embodiments of the invention include conjugated polymer compositions useful in devices such as field effect transistors as well as devices that incorporate such compositions. For example, in some embodiments of the invention, a plurality of directionally aligned polymer fibers within the bundle are adapted to transport charge between source and drain electrodes in a field effect transistor such that the field effect saturation mobility of the plurality of directionally aligned polymer fibers in the field effect transistor is at least 10 cm$^2$/Vs. In certain embodiments of the invention, the field effect saturation mobility of the plurality of directionally aligned polymer fibers in the field effect transistor is at least 25 cm$^2$/Vs. In typical embodiments, the polymer fiber composition forms an organic semiconductor film that is disposed on a substrate, and the plurality of polymer fibers are aligned at the interface between the substrate and the polymer fibers.

In embodiments of the invention, the conjugated polymers used in the capillary methods comprise regioregular polymers. In some embodiments of the invention, the conjugated polymers comprise a regioregular conjugated main chain section, for example a regioregular conjugated main chain section having a repeat unit that comprises a pyridine of the structure:

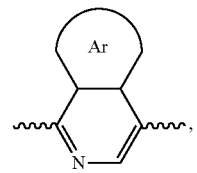

wherein Ar is a substituted or non-substituted aromatic functional group, or Ar is nothing and the valence of the pyridine ring is completed with hydrogen. In such embodiments of the invention, the pyridine is regioregularly arranged along the conjugated main chain section. Optionally, for example, the pyridine unit comprises:

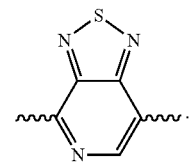

In some embodiments of the invention the repeat unit comprises a dithiophene of the structure

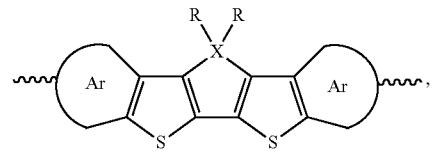

wherein each Ar is independently a substituted or non-substituted aromatic functional group, or each Ar is independently nothing and the valence of its respective thiophene ring is completed with hydrogen, each R is independently hydrogen or a substituted or non-substituted alkyl, aryl or alkoxy chain, and X is C, Si, Ge, N or P. Optionally, for example, the dithiophene unit comprises:

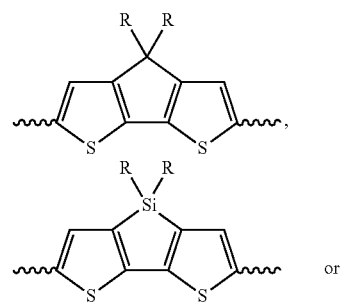

or

-continued

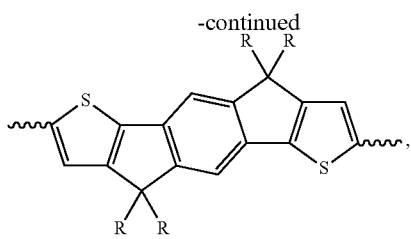

wherein each R is independently hydrogen or a substituted or non-substituted alkyl, aryl or alkoxy chain.

In some embodiments of the invention, the regioregular polymer has a main chain section that includes a repeat unit containing a pyridine of the structure

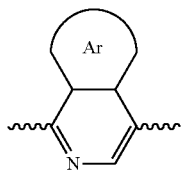

or a dithiophene of the structure

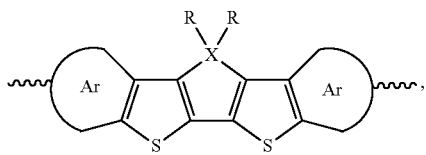

or a combination thereof, where each Ar is independently nothing or a substituted or non-substituted aromatic functional group, each R is independently hydrogen or a substituted or non-substituted alkyl, aryl or alkoxy chain, and X is C, Si, Ge, N or P. When Ar is nothing, the valence of the respective pyridine or thiophene ring is completed with hydrogen. In some embodiments, the R groups can be the same. The substituted or non-substituted aromatic functional group can include one or more alkyl or aryl chains, each of which independently can be a $C_6$-$C_{30}$ substituted or non-substituted alkyl or aryl chain, —$(CH_2CH_2O)n$ (n=2~20), $C_6H_5$, —$C_nF_{(2n+1)}$ (n=2~20), —$(CH_2)_nN(CH_3)_3Br$ (n=2~20), —$(CH_2)_nN(C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3). The substituted or non-substituted alkyl, aryl or alkoxy chain can be a $C_6$-$C_{30}$ substituted or non-substituted alkyl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), 2-ethylhexyl, $PhC_mH_{2m+1}$ (m=1-20), —$(CH_2)_nN(C_2H_5)_2$ (n=2~20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3).

Figure 16:
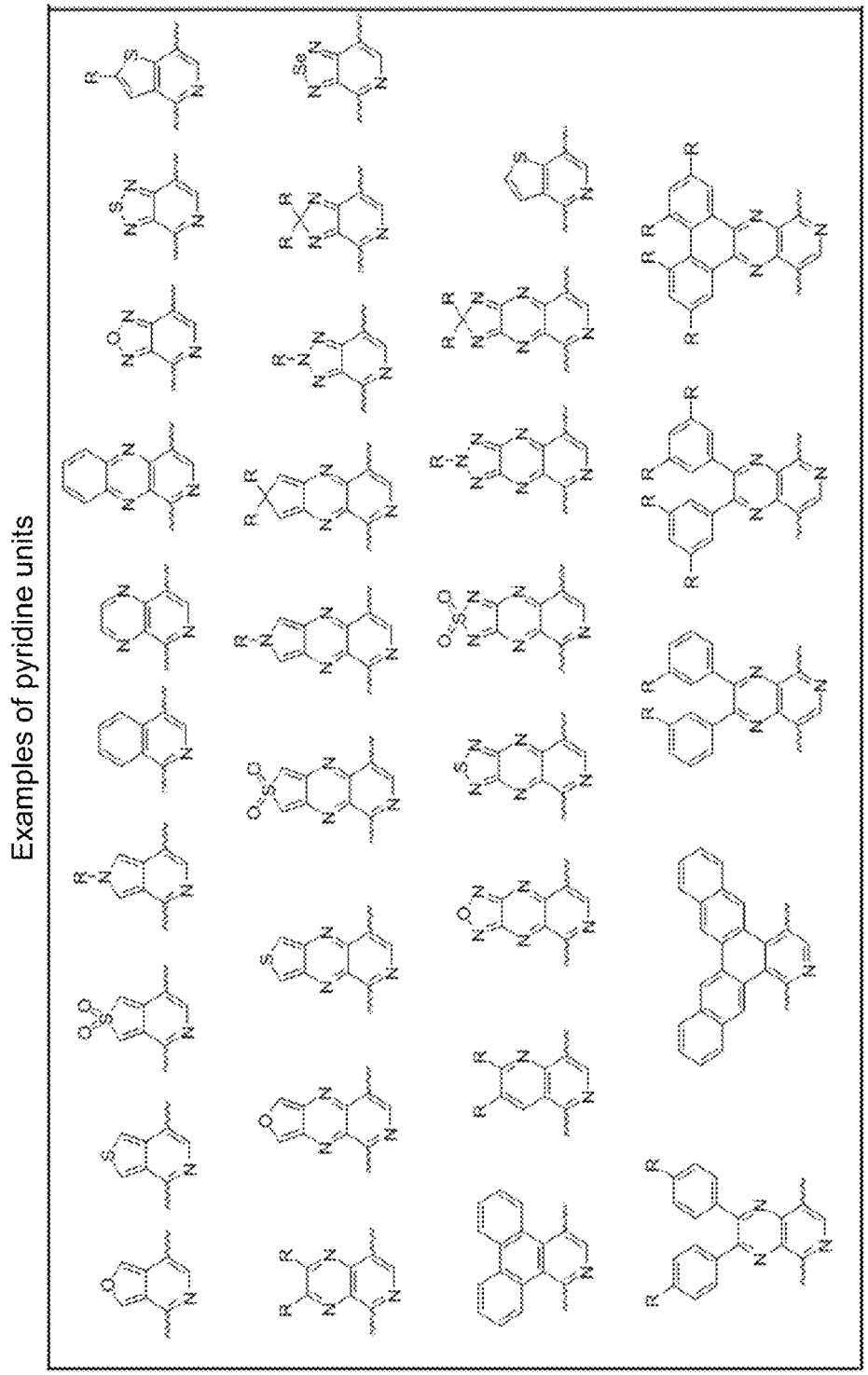
FIG. 16 shows a table of illustrative pyridine units that can be used to make one or more embodiments of the present invention.

In embodiments of the regioregular polymer, the repeat unit of the regioregular conjugated main chain section can contain a pyridine unit as shown in FIG. 16, where each R is independently a substituted or non-substituted alkyl chain, which can be a $C_6$-$C_{30}$ substituted or non-substituted alkyl chain, —$(CH_2CH_2O)n$ (n=2~20), $C_6H_5$, —$C_nF_{(2n+1)}$ (n=2~20), —$(CH_2)_nN(CH_3)_3Br$ (n=2~20), —$(CH_2)_nN(C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3); in some embodiments, the R groups can be the same.

Figure 17:
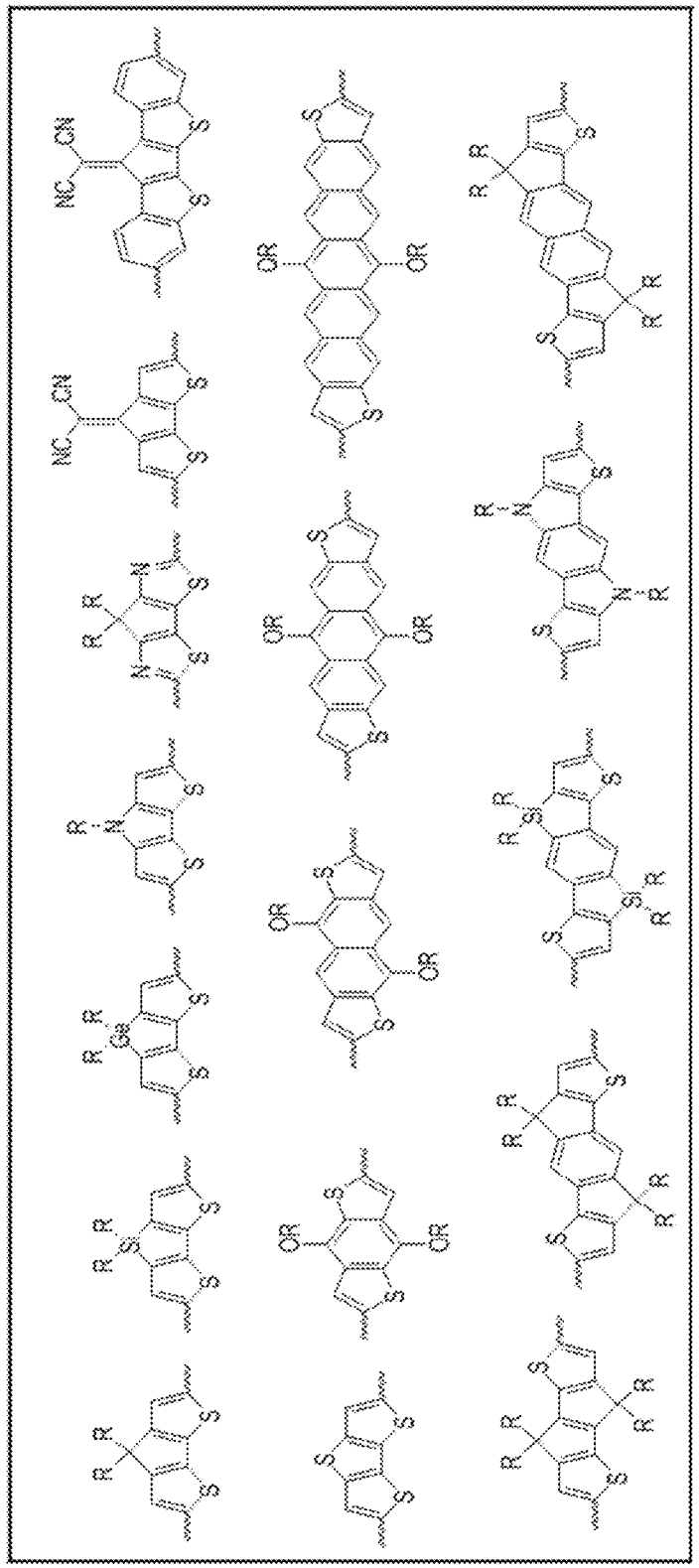
FIG. 17 shows a table of illustrative dithiophene units that can be used to make one or more embodiments of the present invention.

In embodiments of the regioregular polymer, the repeat unit of the regioregular conjugated main chain section can contain a dithiophene unit as shown in FIG. 17, where each R is independently a substituted or non-substituted alkyl, aryl or alkoxy chain, which can be a $C_6$-$C_{30}$ substituted or non-substituted alkyl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), —$(CH_2)_nN(C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3); in some embodiments, the R groups can be the same, and in some embodiments, a repeat unit may contain any combination of a pyridine unit and a dithiophene unit.

In some embodiments, the regioregular polymer comprises a regioregular conjugated main chain having a repeat unit of the following structure:

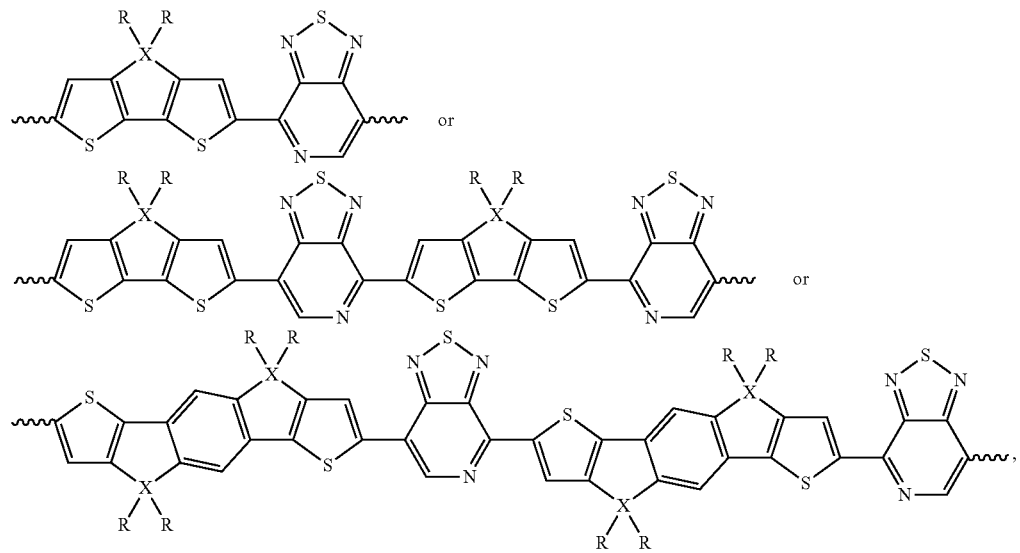

where each R is independently hydrogen or a substituted or non-substituted alkyl, aryl or alkoxy chain, and X is C, Si, Ge, N or P. In particular embodiments, the repeat unit has the following structure:

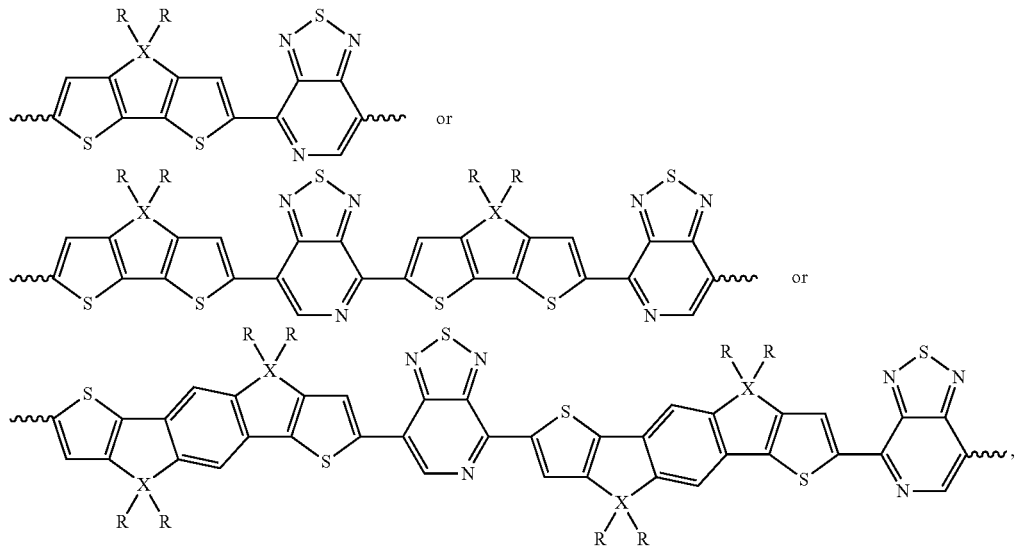

where each $R_1$ is independently hydrogen or a substituted or non-substituted alkyl, aryl or alkoxy chain. In some embodiments, the R groups can be the same, and the $R_1$ groups can be the same. In some embodiments, each R or $R_1$ can be a $C_6$-$C_{30}$ substituted or non-substituted alkyl, aryl or alkoxy chain, —(CH$_2$CH$_2$O)n (n=2~20), $C_6H_5$, —$C_nF_{(2n+1)}$ (n=2~20), —(CH$_2$)$_n$N(CH$_3$)$_3$Br (n=2~20), or —(CH$_2$)$_n$N(C$_2$H$_5$)$_2$ (n=2~20), 2-ethylhexyl, PhC$_m$H$_{2m+1}$ (m=1-20), —(CH$_2$)$_n$Si(C$_m$H$_{2m+1}$)$_3$ (m, n=1 to 20), or —(CH$_2$)$_n$Si(OSi(C$_m$H$_{2m+1}$)$_3$)$_x$(C$_p$H$_{2p+1}$)$_y$ (m, n, p=1 to 20, x+y=3); and/or X can be Si. In some embodiments, the polymer is prepared by a method described in U.S. Patent publication No. 20120322966.

Figure 18:
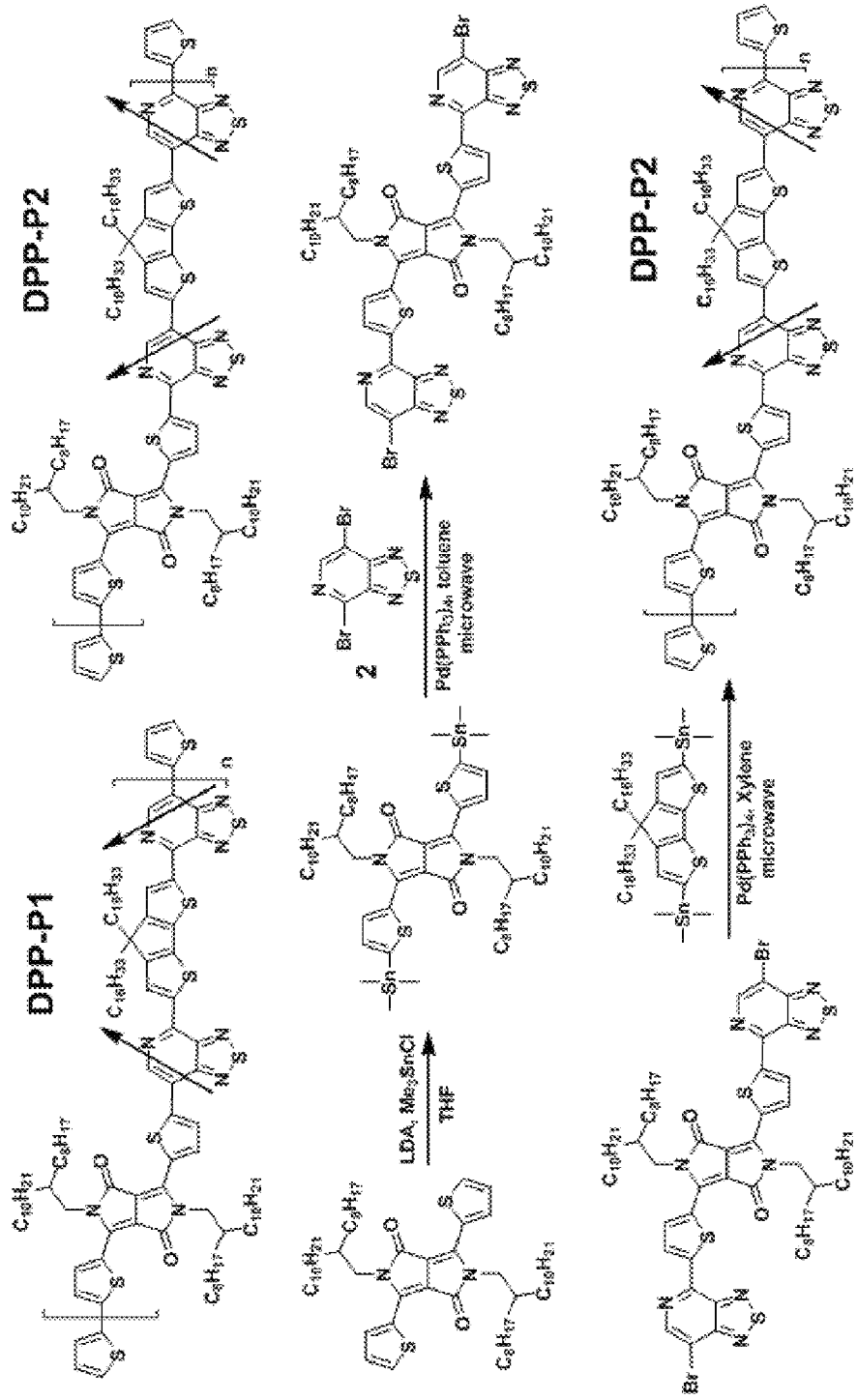
FIG. 18 is a schematic showing the synthesis of DPP-P2.
Figure 19:
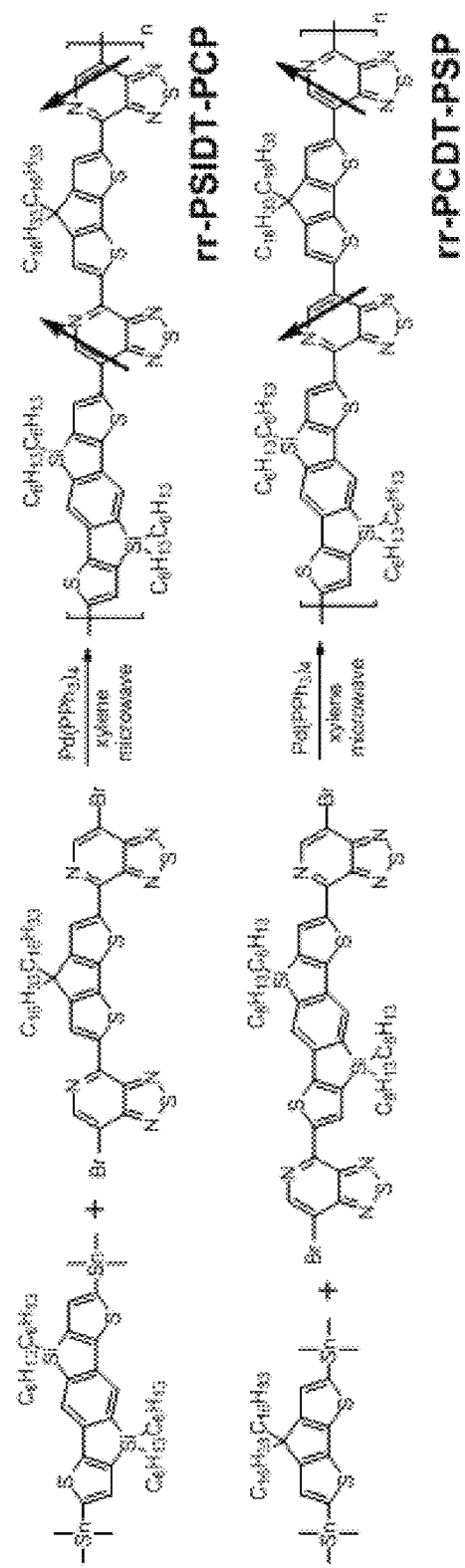
FIG. 19 is a schematic of the synthesis of rr-PSIDT-PCP and rr-PCDT-PSP solution.
Figure 20:
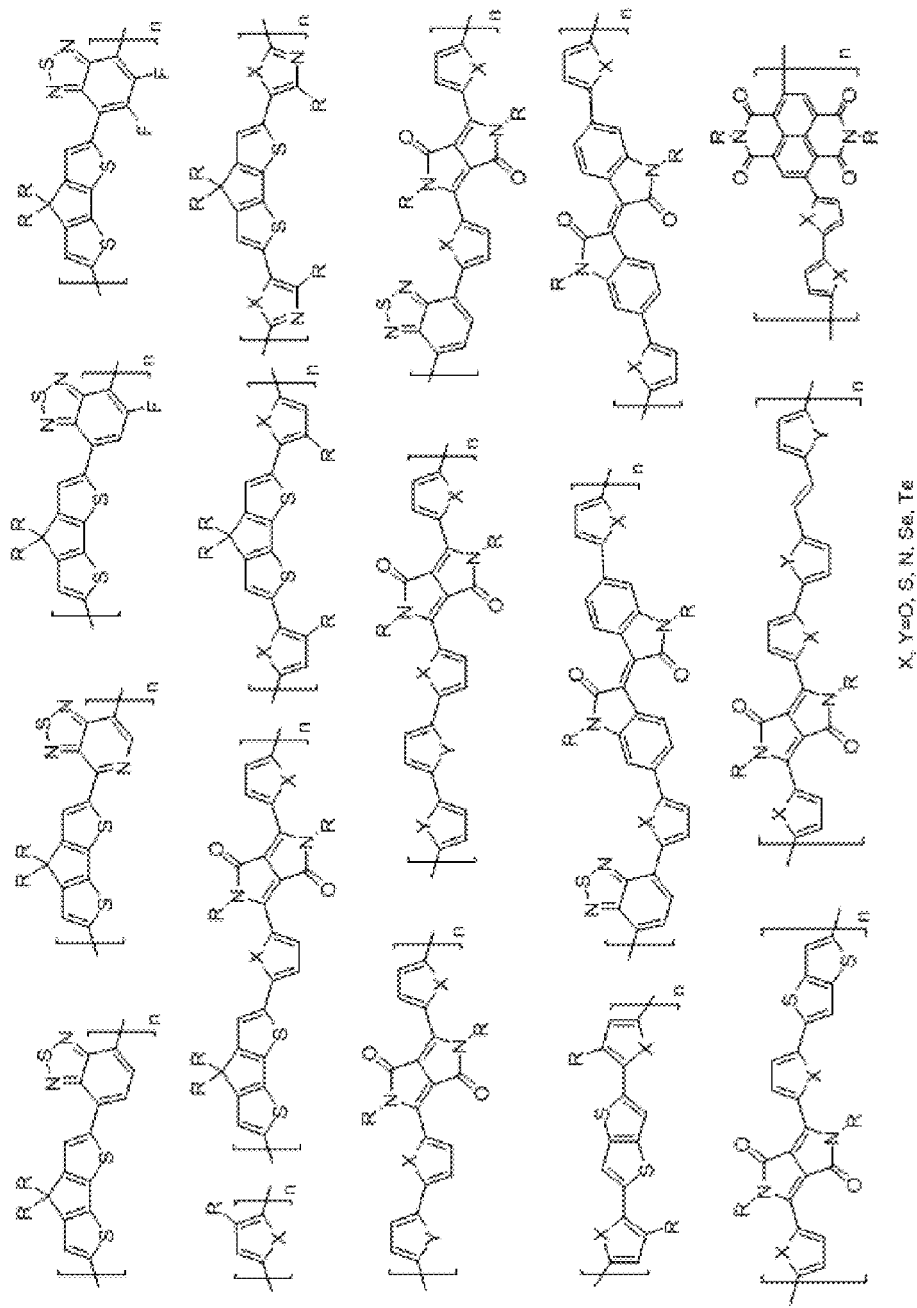
FIG. 20 shows a table of illustrative compounds that can be used to make one or more embodiments of the present invention.

The organic semiconductor film can include an organic semiconductor such as, but not limited to, the polymer structures in FIGS. 18-20, wherein each R is independently hydrogen or a substituted or non-substituted alkyl, aryl or alkoxy chain. In some embodiments, the substituted or non-substituted alkyl, aryl or alkoxy chain is a $C_6$-$C_{30}$ substituted or non-substituted alkyl, aryl or alkoxy chain, —(CH$_2$CH$_2$O)n (n=2~20), $C_6H_5$, —$C_nF_{(2n+1)}$ (n=2~20), —(CH$_2$)$_n$N(CH$_3$)$_3$Br (n=2~20), —(CH$_2$)$_n$N(C$_2$H$_5$)$_2$ (n=2~20), 2-ethylhexyl, PhC$_m$H$_{2m+1}$ (m=1-20), —(CH$_2$)$_n$Si(C$_m$H$_{2m+1}$)$_3$ (m, n=1 to 20), or —(CH$_2$)$_n$Si(OSi(C$_m$H$_{2m+1}$)$_3$)$_x$(C$_p$H$_{2p+1}$)$_y$ (m, n, p=1 to 20, x+y=3). In some embodiments, X is C or Si. In particular embodiments, each R is $C_{12}H_{25}$, each R is $C_{16}H_{33}$, each R is 2-ethylhexyl, or each R is PhC$_6$H$_{13}$. In some embodiments, the polymer can have a narrow PDI value of around 1.5 and/or a Mn value of about 300 KDa. In some embodiments, the polymer can have a narrow PDI value of around or less than 1.5 and/or an Mn value of about 140 KDa or 50 KDa. In specific instances the polymer has a Mn value of 50 KDa.

The solvent of an organic semiconductor solution can be, but is not limited to, tetrahydrofuran, toluene, o-xylene, p-xylene, xylenes, chlorobenzene, 1,2-dichlorobenzene, 1,2,4-triclorobenzene, or chloroform.

The present invention may be better understood by referring to the accompanying examples, which are intended for illustration purposes only and should not in any sense be construed as limiting the scope of the invention.

EXAMPLES

Example 1

Self-Assembly of Highly Oriented Nanocrystalline Semiconducting Polymers with High Mobility A sandwich tunnel system is provided, which is separated by functionalized glass spacers to induce capillary action for controlling the polymer nanostructure, crystallinity, and charge transport. Using capillary action, saturation mobilities with average values of 21.3 cm$^2$V$^{-1}$ s$^{-1}$ and 18.5 cm$^2$V$^{-1}$ s$^{-1}$ have been demonstrated on two different semiconducting polymers at a transistor channel length of 80 μm. These values are limited by the source-drain contact resistance, $R_c$. Using a longer channel length of 140 μm where the contact resistance is less important, $\mu_h$=36.3 cm$^2$V$^{-1}$ s$^{-1}$ was measured. Extrapolating to infinite channel length where $R_c$ is unimportant, the intrinsic mobility for PCDTPT ($M_n$=140 kDa) at this degree of chain alignment and structural order is $\mu_h \approx$36.3 cm$^2$V$^{-1}$ s$^{-1}$. These results demonstrate a pathway towards high performance, solution processable, and low-cost organic electronics.

In this example, the sandwich casting system is comprised of two Si/SiO$_2$ substrates, separated by two glass spacers on both short sides (see FIG. 1A for a general schematic illustration). Specifically, the sandwich tunnel system consists of two silicon substrates (12.2×7.7×0.5 mm) with a pair of glass spacers (7.7×2.0×1.0 mm) inserted at two ends. Polymer solution (75 μL) is added into the tunnel (8.2×7.7× 1.0 mm). The polymer solution is easily trapped in the tunnel by surface tension, even if the system is slightly tilted along the longitudinal direction. Capillary-mediated film deposition is then achieved through slow solvent drying. For an amount of 75 μL dilute polymer solution (0.25 mg ml$^{-1}$) prepared in chlorobenzene, 5 hours are required for solvent evaporation in a closed petri dish at room temperature under N$_2$ atmosphere. Here, the capillary action, generated by the glass spacers, is utilized to promote polymer chain self-alignment along uniaxial nano-grooves on the textured substrate (FIGS. 8A-B). The strength of the capillary action can be readily tailored by surface treatment and functionalization with self-assembled monolayers (SAMs) of selected organosilanes, such as perfluorodecyltrichlorosilane (FDTS), n-decyltrichlorosilane (DTS) and 6-phenylhexyl-trichlorosilane (PTS) (see FIGS. 9A-C for the relevant molecular structures).

Figure 10:
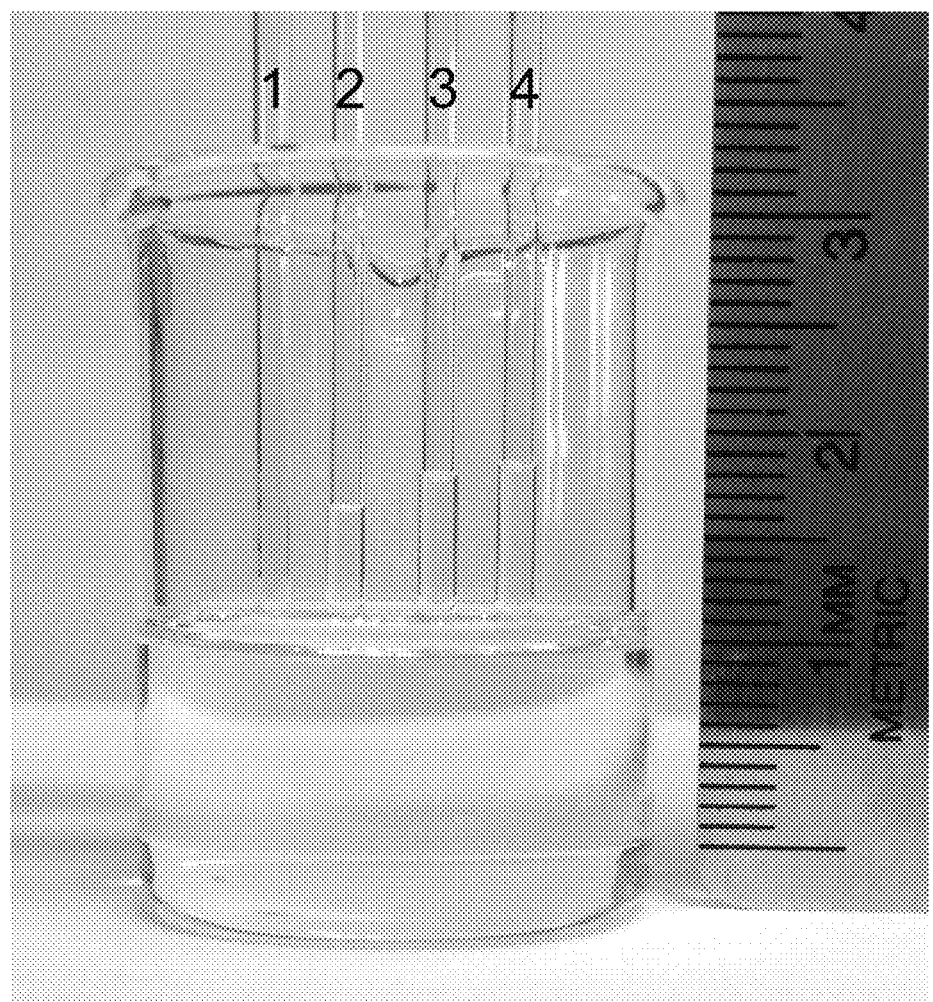
FIG. 10 shows the results of a capillary height test in the glass capillary tubes (inner diameter ca. 1.2 mm) with various surface treatments, using pure chlorobenzene solvent as testing medium, in accordance with one or more embodiments of the present invention. Tube 1, 2 and 3 are treated by FDTS, DTS and PTS, respectively and tube 4 is treated by piranha solution. The capillary tubes treated with PTS and cleaned by piranha (tubes 3 and 4 respectively) show the highest level (ca. 7 mm) while the tube treated with DTS (tube 2) shows the height of ca. 5 mm. The last tube treated with FDTS (tube 1) has the minimal height close to the liquid level of the container. The results tested with the pure solvent chlorobenzene are similar to those tested with the polymer solution prepared in chlorobenzene.

The height of the polymer solution drawn up in the glass capillary tubes in FIG. 1B indicates the strength of capillary action generated by different surface treatments to the tubes. Tubes treated with PTS and piranha solution both showed the highest level (ca. 7 mm), as compared to those treated with DTS (ca. 6 mm) and FDTS (ca. 0 mm). The capillary height tests using the solvent chlorobenzene (rather than the solution) as the medium followed a similar trend (FIG. 10). As expected, the FDTS-treated tube apparently repels the polymer solution, because fluorine-rich chemicals reduce the surface free energy and repel most solvents [24, 25].

Figure 1C:
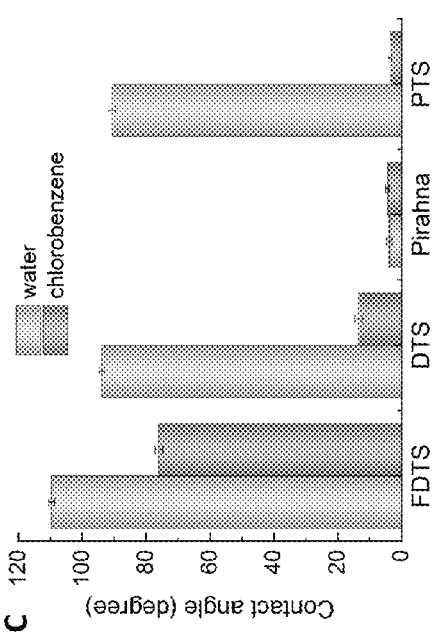

Contact angle measurements were used to further characterize the surface wettability and confirm the variation of capillary action strength in the four different treatments (FIG. 1C). When chlorobenzene was used as the testing medium, contact angles less than 5° were observed for piranha and PTS treated glass slides, indicating a super-oleophilic wettability with the glass attracting the liquid to maximize the contact area on the solid surface or the height in the tube. In contrast, contact angles up to approximately 80° were measured following FDTS treatment, showing a wettability transition from oleophilic to oleophobic, with the glass repelling the liquid to reduce the contact area on the surface or the height in the tube. In order to further establish the validity of the four different surface treatments, water contact angle measurements were also performed. Large differences in the contact angles between the two testing media were observed for FDTS, DTS and PTS treatments indicating that the glass surfaces were successfully functionalized by the SAMs. The piranha-treated glass surface exhibited an amphiphilic wettability with small contact angles)(<5° for the two media, as reported earlier [26].

Inspired by the spontaneous drawing of the polymer solution up the glass capillary tube, such drawing generated by the surface-treated glass spacers in the sandwich system is employed to direct polymer alignment. The drawing effect of capillary action on the guided alignment is schematically illustrated in FIG. 1D. Because of the surface attraction and capillary action generated by the PTS treatment, the solution is drawn and flows toward the spacer. The flow direction is parallel to the uniaxial nano-grooves on the textured substrate and is thus favorable for polymer alignment during solution drying. On the other hand, the surface repulsion caused by the FDTS treatment suppresses such flow toward the spacer; a situation unfavorable to polymer alignment along the uniaxial nano-grooves.

Example 2

Atomic Force Microscopy of Polymer Films

To investigate how the strength of capillary action can affect the polymer alignment on the textured substrate, atomic force microscopy (AFM) in tapping mode was performed to examine and compare the nanomorphology on the bottom surfaces of polymer films (see the details for sample preparation in Example 6), prepared using two opposite treatments (FDTS and PTS) to the spacers in the sandwich systems, using identically nano-grooved Si/SiO$_2$ substrates. The donor-acceptor copolymer, poly[4-(4,4-di-hexadecyl-4H-cyclopenta[1,2-b:5,4-b']dithiophen-2-yl)-alt-[1,2,5]thiadiazolo[3,4-c]pyridine] (PCDTPT, M$_n$=140 kDa) was used to prepare the solution [27].

Figure 2B:
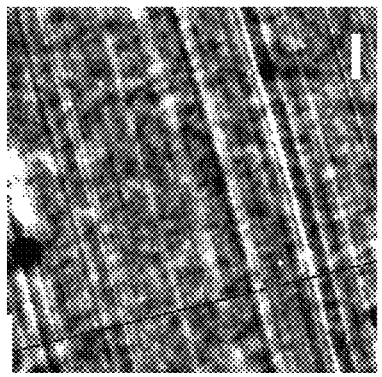
FIGS. 2A-D show the morphology analysis of the bottom surfaces of polymer films obtained from strong and weak capillary actions, in accordance with one or more embodiments of the present invention. Topographic images are shown of the bottom surfaces of two deposited films approaching FDTS-treated spacer (FIG. 2A) and PTS-treated spacer (FIG. 2B). Scale bars represent 200 nm.
Figure 2D:
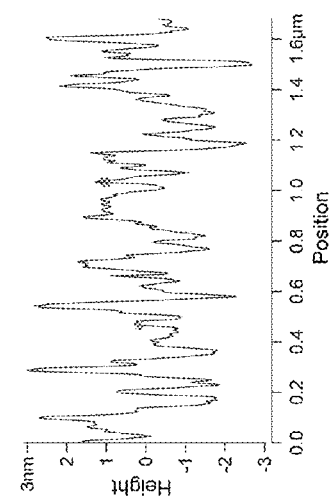
Figure 2A:
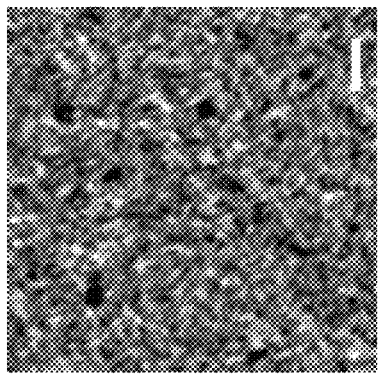
Figure 2C:
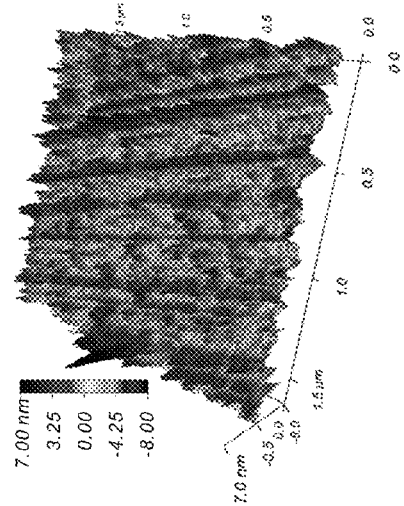
Figure 11:
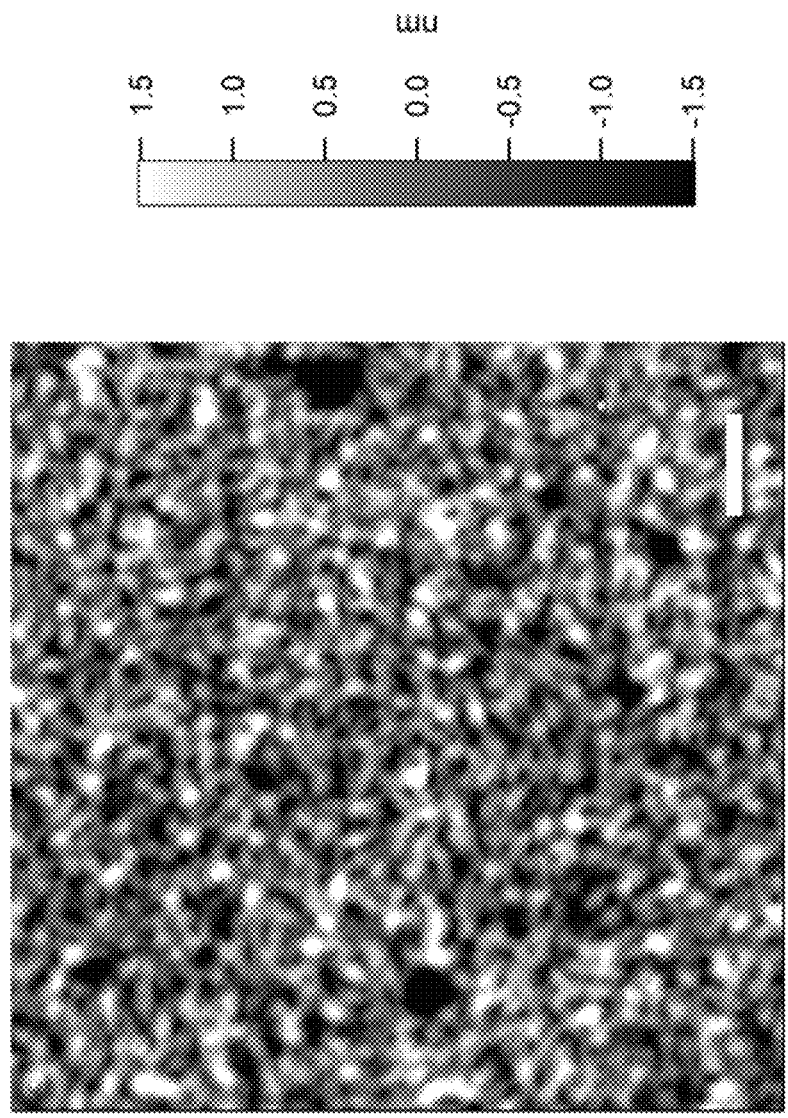
FIG. 11 is an AFM topographic image of the top surface of PCDTPT film prepared by PTS-treated spacer, in accordance with one or more embodiments of the present invention. The top surface of the film is disordered. The scale bar indicates the length of 200 nm.
Figure 12A:
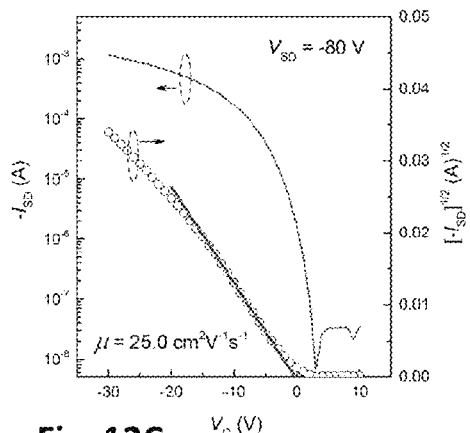
FIGS. 12A-E show the transfer characteristics of TFT devices (L=80 μm) with PCDTPT films prepared by different surface treatments over the spacers: treated by PTS (FIG. 12A), Piranha (FIG. 12B), DTS (FIG. 12C), FDTS (FIG. 12D), and no spacer used (dip coating, FIG. 12E), in accordance with one or more embodiments of the present invention.
Figure 12B:
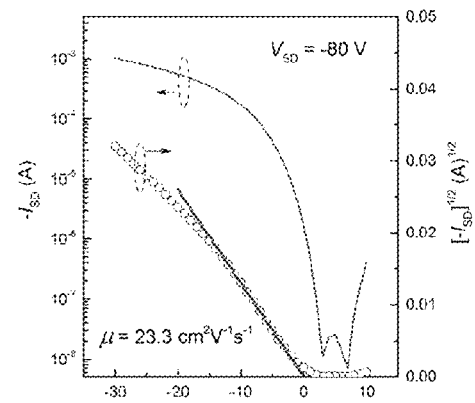
Figure 12C:
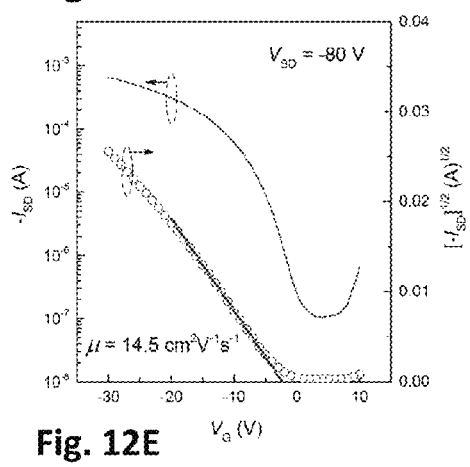
Figure 12D:
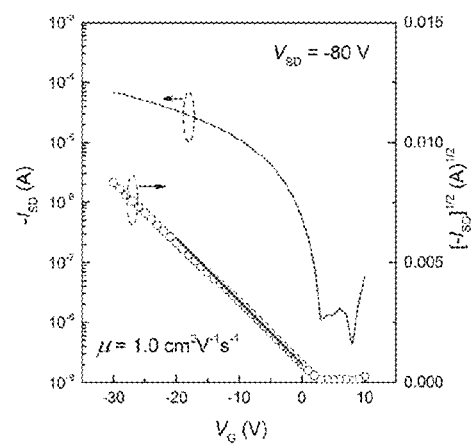
Figure 12E:
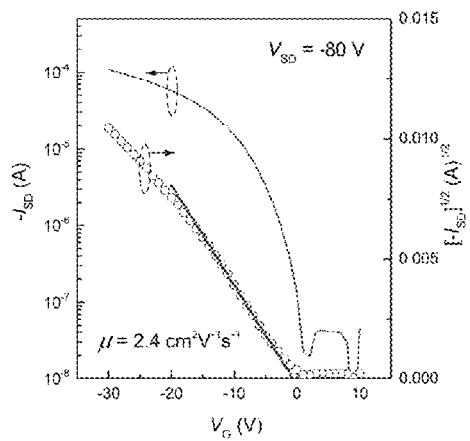
Figure 13A:
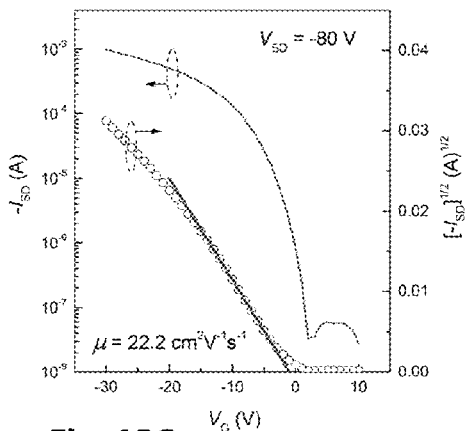
FIGS. 13A-E show the transfer characteristics of TFT devices (L=80 μm) with CDTBTZ films prepared by different surface treatments over the spacers: treated by PTS (FIG. 13A), Piranha (FIG. 13B), DTS (FIG. 13C), FDTS (FIG. 13D), and no spacer used (dip coating, FIG. 13E), in accordance with one or more embodiments of the present invention.
Figure 13B:
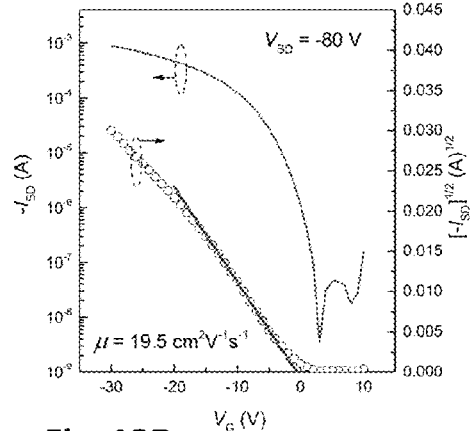
Figure 13C:
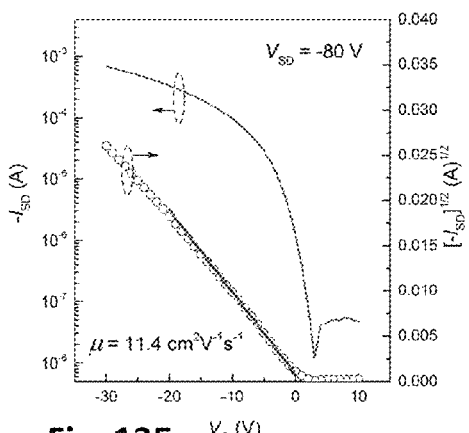
Figure 13D:
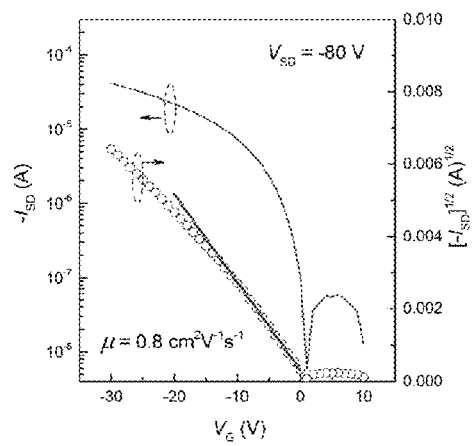
Figure 13E:
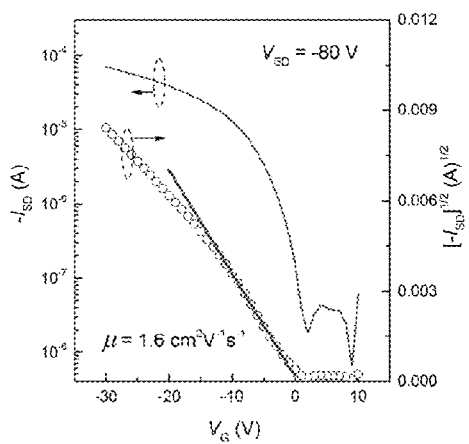

FIGS. 2A and 2B show the AFM topographic images of the bottom surfaces (taken from areas approaching the spacers) of two deposited films prepared using the spacers with FDTS treatment and PTS treatment, respectively. The film prepared using FDTS-treated spacers exhibits featureless surfaces and is apparently amorphous. By comparison, the film prepared using PTS-treated spacers shows groove/ridge-like nanostructures, aligned parallel to the uniaxial nano-grooves. These oriented nanostructures are present throughout the bottom surface with widths of 50-100 nm and heights of ca. 6 nm (FIGS. 2C and 2D), comparable to the dimensions of the uniaxial nano-grooves on the substrate (FIG. 8A). The root-mean-square (RMS) surface roughness of the FDTS-treated film ($\sigma_{RMS}$=0.64 nm) is significantly lower than that of the PTS-treated film ($\sigma_{RMS}$=1.55 nm) and the textured Si/SiO$_2$ substrate ($\sigma_{RMS}$=1.57 nm). The relatively smooth surface suggests that the repulsion effect from FDTS treatment renders the polymer chains in random orientation; the deposited film did not recognize the uniaxial nano-grooves on the substrate. In contrast, the surface attraction/capillary action from PTS treatment resulted in a more structured topography with roughness comparable to that of the substrate, implying that the polymer chains have diffused, nucleated and grown along the uniaxial nano-grooves on the patterned substrate. This leads to a significantly improved chain-aligned nanomorphology with finer, ordered, and regularly connected grains, as observed in FIGS. 2B and 2C. It is expected that this nanomorphology should result in continuous pathways necessary for efficient charge transport and impart superior anisotropic charge transport to the bottom surface of the film. On the other hand, the topography on the top surface of the deposited film using PTS-treated spacers appears essentially amorphous (see FIG. 11), indicating that only the first few monolayers of polymer are aligned upon solution drying [12, 15].

Example 3

Grazing Incidence Wide Angle X-Ray Scattering of Films

Figure 3A:
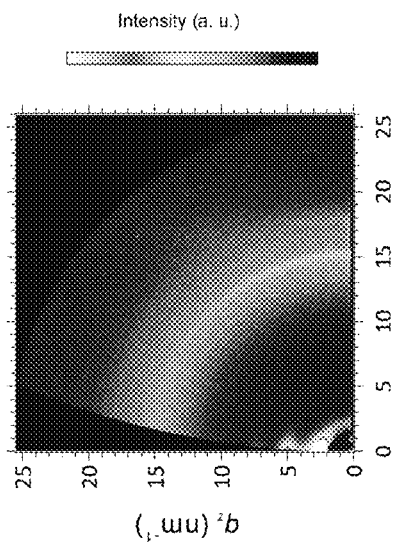
FIGS. 3A-E show GIWAXS measurements of polymer films prepared by weak and strong capillary actions, in accordance with one or more embodiments of the present invention. GIWAXS patterns are shown of the films fabricated with FDTS-treated spacer (FIG. 3A) and PTS-treated spacer (FIG. 3B). GIWAXS line profiles are shown of the two films using constant, grazing incident angle with out-of-plane (FIG. 3C) and in-plane (FIG. 3D) scattering geometry. "q" denotes the scattering vector. The insets illustrate the measurements for out-of-plane and in-plane geometries.
Figure 3B:
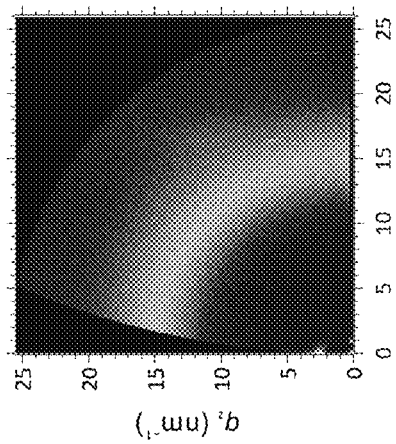
Figure 3C:
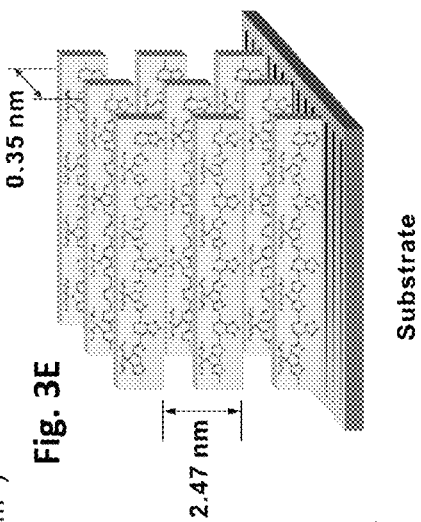
Figure 3D:
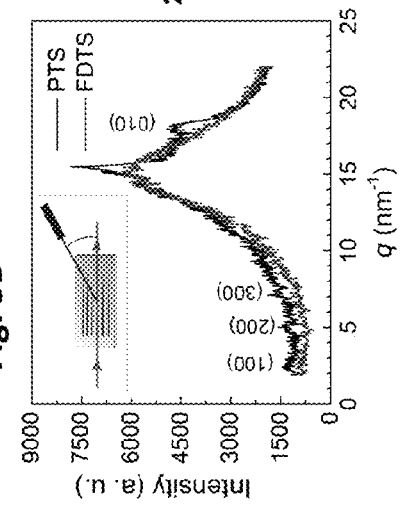
Figure 3E:
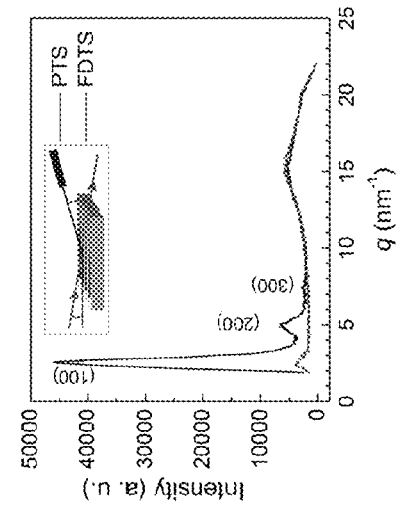
Figure 5A:
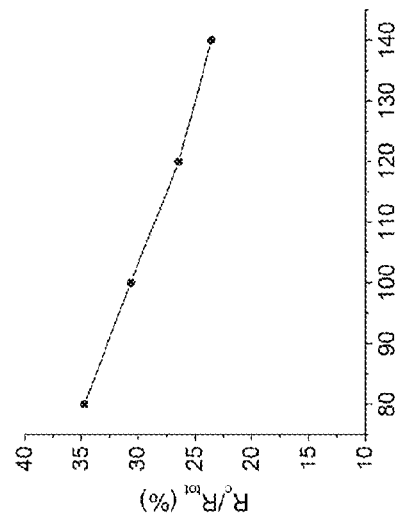
FIG. 5A is a measurement of the channel resistance as a function of the channel length, in accordance with one or more embodiments of the present invention. The contact resistance, R$_c$ is the value extrapolated to L=0.
Figure 5B:
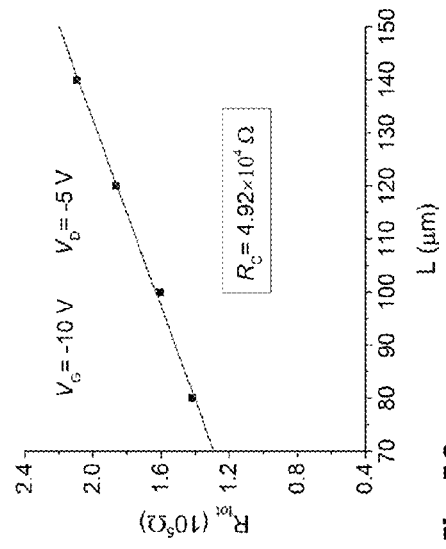
FIG. 5B is a graph showing the ratio of contact resistance over the total channel resistance as a function of the channel length.
Figure 5C:
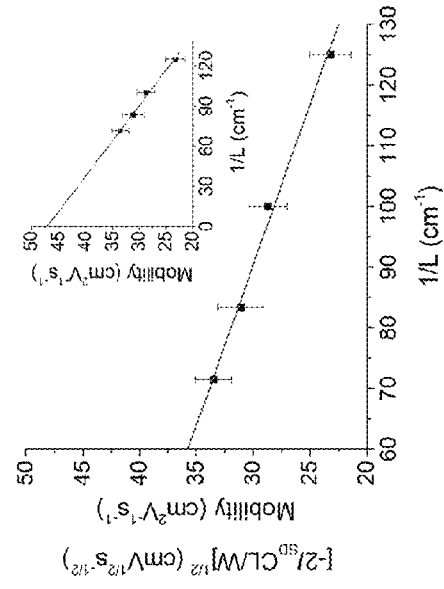
FIG. 5C is a graph showing the representative transfer characteristics of devices with channel lengths of 80 (red), 100 (green) and 140 (blue) μm. Data obtained from the saturated regime were fitted to obtain the hole mobilities.
Figure 5D:
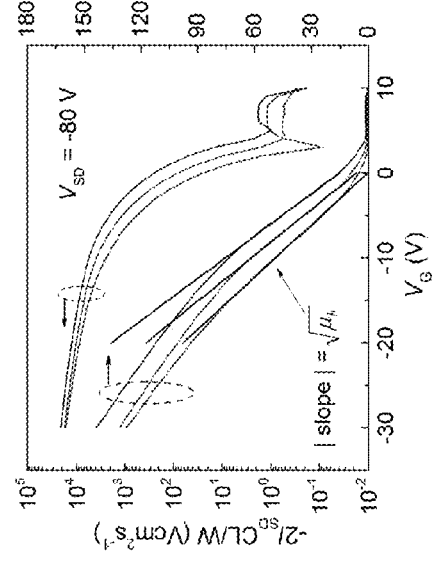
FIG. 5D is a graph showing the channel length related average saturation mobility of PCDTBT (M$_n$=140 kDa). The average and error bars were obtained from the results obtained from 8 devices. The inset in FIG. 5D shows the mobility extrapolation to infinite channel length. The lines are linear fits to the data. All the devices are fabricated from PTS-treated spacers.

As the AFM analysis is limited to the surface morphology, to gain deeper insight into the molecular packing and crystallinity in the deposited films, measurements by grazing incidence wide angle X-ray scattering (GIWAXS) were conducted on the deposited films. Several noticeable changes in the polymer microstructure are observed in the 2D GIWAXS patterns for the films prepared using FDTS-treated spacers and PTS-treated spacers, as shown in FIGS. 3A and 3B, respectively. Only minor first-order lamellar scattering can be observed in FIG. 3A, indicating the lack of long-range order; the film prepared using FDTS-treated spacers is essentially amorphous. By contrast, the pattern of the film, prepared using PTS-treated spacers exhibits numerous diffraction features. One can observe (100), (200) and (300) scattering peaks, consistent with aligned polymer chains, and clear indication of π-π interchain stacking (FIG. 3B). The X-ray scattering line profiles (out-of-plane, FIG. 3C; in-plane, FIG. 3D) extracted from the 2D patterns quantitatively revealed the microstructure differences between the two types of films. As shown in FIG. 3C, when PTS-treated spacers were used, the strength of the (100)

peak (first order) is 11-fold enhanced and the (200) and (300) peaks corresponding to second and third order reflections appear at q~4.82 nm$^{-1}$ and 7.46 nm$^{-1}$ (FIG. 3C), implying that the structural coherence length increases significantly. Moreover, it is noted that the position of the first order peak shifts from q~2.37 nm$^{-1}$ to 2.54 nm$^{-1}$, indicating that the interchain distance decreases so that the lamellar structure becomes more compact. The increase of long-range order and the decrease in the interchain distance are favorable for forming a linear backbone conformation with enhanced p-orbital overlap over an extended conjugated system, thus leading to improved charge transport [28-31]. As shown in FIG. 3D, the peak corresponding to the π-π interchain stacking is observed at q~17.93 nm$^{-1}$ (corresponding to a d-spacing of 0.35 nm) from the (010) reflection, together with a peak at q~15.48 nm$^{-1}$, which is probably indicative of side chain interdigitation or another π-stacking arrangement induced by the relative sliding of polymer backbones [32]. The observation of high order reflections accompanied by strong intermolecular π-π stacking strongly support the assertion that the macromolecules adopt an edge-on arrangement with a lamella thickness of 2.47 nm and a π-stacking distance of 0.35 nm [33], as illustrated in FIG. 3E. These results obtained from GIWAXS measurements are in good agreement with the surface information observed from AFM, thereby confirming that capillary action substantially promotes the behavior of unidirectional self-assembly and anisotropic alignment on the textured substrates.

Example 4

TFT Device Performance of CDTBTZ

By implementing the sandwich casting with various surface treatments over the inserted spacers, polymer TFT devices were fabricated with the pre-deposited Ni/Au source and drain electrodes on the SiO$_2$/Si substrates to define the geometry of bottom-contact and bottom-gate. In addition to PCDTPT, investigation of TFT performance was extended to a second donor-acceptor copolymer, poly[2,6-(4,4-bis-alkyl-4H-cyclopenta-[2,1-b;3,4-b0]-dithiophene)-alt-4,7-(2,1,3-enzothiadiazole)], (cyclopenta-dithiophene-benzothiadiazole) (CDTBTZ, $M_n$=120 kDa) [13]. See FIGS. 4A and 4B for the molecular structures. The optimum performance was obtained from devices processed with the source-to-drain (S-D) orientation parallel to the nano-grooves and to the flow direction with the procedures described above for PCDTPT; the PTS-treated spacers were again used in a tilted sandwich system at approximately 12.5° inclination. Transfer and output characteristics of the best fabricated TFT are shown in FIGS. 4C and 4D, respectively. The mobility was extracted from the saturated region at low gate voltages (FIG. 4C; $V_G$: −4V to −13V), where there is good saturation in the corresponding output curves (FIG. 4D).

It is noted that the output data at high $V_G$ do not show saturation [34]. Thus one can obtain accurate mobilities only in the low $V_G$ regime ($V_G$≤20 V). The result of the non-saturation can be seen in the change in slope of the transconductance data at $V_G$>20V. Low hysteresis is observed with multi-cycles of forward and reverse sweeping of gate-source voltage (FIG. 4E), suggesting that a low density of shallow traps is present at the polymer-dielectric interface. This is consistent with the small value of the turn-on voltage ($V_{th}$~0). The superior TFT characteristics offered by the aligned polymers are competitive with TFTs made using inorganic semiconductors and single-crystalline organic small molecules [35-40].

The hole mobility obtained from these devices is particularly sensitive to the strength of capillary action generated by the spacers. To verify the sensitivity, the S-D orientation of all devices was maintained parallel to the uniaxial nano-grooves on the textured substrate, while altering the treatments to the pair of spacers. Using spacers treated with PTS and piranha, which exhibit similar strengths of capillary action and contact angles (FIGS. 1B and D), results in comparable average mobilities (obtained with twenty independent devices) of 21.3 cm$^2$V$^{-1}$s$^{-1}$ and 18.5 cm$^2$V$^{-1}$s$^{-1}$ for PCDTPT and CDTBTZ, respectively, as shown in FIG. 4F. The highest values obtained were 25.4 cm$^2$V$^{-1}$s$^{-1}$ and 22.2 cm$^2$V$^{-1}$s$^{-1}$ for the two semiconducting polymers at transistor channel length of 80 μm. When the surface treatment to the spacers is changed to increase contact angle or attenuate capillary action, such as using DTS and FDTS, the average saturation mobility decreases for devices prepared from both polymers. Specifically, the average saturation mobility obtained from PTS treatment is 14.9 and 22.8-fold higher than those from FDTS treatment for PCDTPT and CDTBTZ, respectively (FIGS. 12 and 13). This is in good agreement with AFM observation and GIWAXS investigation on the films prepared by the two treatments. In polymer films having a high degree of alignment and crystallinity, charge carriers can travel more efficiently along the conjugated backbone in one-dimension with lower probability of hopping and trapping at grain boundaries and structural imperfections. Moreover, comparing the devices fabricated on the same nano-grooved substrates by conventional dip coating (no spacer used), it is evident that sandwich casting with strong capillary action generated by PTS-treated spacers has significantly enhanced the mobility, as seen by the increase in the average saturation mobility by factors of 7.3 and 10.7 for PCDTPT and CDTBTZ, respectively (FIG. 4F).

To obtain further insight into the anisotropic charge transport, the dependence of mobility on the S-D orientation relative to polymer alignment was examined while retaining PTS treatment to all the spacers used. As displayed in FIG. 4G, the anisotropy between the average saturation mobility of devices with the S-D oriented parallel to polymer alignment versus devices with the S-D perpendicular to polymer alignment are 13.6 and 17.6 for PCDTPT and CDTBTZ, respectively, demonstrating that intramolecular charge transport along the π-conjugated backbones is dominant over the transport by intermolecular charge hopping through π-π stacking. The performance of devices, prepared on the native substrates without nano-grooves but with the S-D parallel to the solution flow drawn by capillary action, remained only slightly higher compared to that of devices with the S-D perpendicular to the alignment, demonstrating that both capillary action and the uniaxial nano-grooves on the substrate contribute to the polymer self-organization with unidirectional alignment and more efficient charge transport along the linear backbones.

Example 5

Gravitational and Inclination Influence on TFT Device Performance

The force of gravity due to inclination of the sandwich system also affects the TFT device performance. FIG. 6 demonstrates the solution drying process in the tilted sandwich system (θ~12.5°). The polymer solution gradually shrinks to the centre and slowly forms into a sandglass-like shape as the consequence of solvent evaporation through the two open lateral sides (FIG. 6B, left and right). The direction of solution movement is indicated by arrow in FIG. 1D. An asymmetric liquid bridge is maintained between the pair of PTS-treated spacers for several minutes because of the spacer-generated capillary action. The gravity caused more solution to spontaneously flow toward the low-lying spacer, while less solution was left behind near the high-lying spacer after the liquid bridge broke up. During solution drying, the semiconducting polymer film was gradually formed on the patterned substrate.

The solution flow toward the spacer prompted the study of how the angle-dependent inclination effect interacts with capillary action generated by the spacer. To eliminate the impact of factors such as geometric anisotropy and the change in device location, the S-D orientation was retained to be parallel to the uniaxial nano-groove on the textured substrate. Devices approaching the low-lying spacer (distance: ca. 0.5 mm) were examined and prepared. As shown in FIG. 6C, the average saturation mobility increases as the sandwich system is tilted from 0° to 12.5°, for both PTS and FDTS treatments applied to the pair of spacers. This can be rationally attributed to the gravity assistance in overcoming the contact angle hysteresis (ca. 8°; i.e., the difference between advancing and receding contact angle that indicates the extent to which the liquid sticks to the substrate) on the patterned substrate [31], which derives from the adhesive force of the substrate and acts to hinder the liquid movement [41]. To overcome this sticking effect, the tilted structure was used so that the effect of gravity would improve the self-assembly of macroscopic orientation. More solution flows towards the low-lying spacer after such inclination to the sandwich system with PTS-treated spacers, leading to the considerable increase in average saturation mobility from 8.0 $cm^2V^{-1}$ $s^{-1}$ to 21.8 $cm^2V^{-1}$ $s^{-1}$. On the other hand, only a slight increase is observed with the inclination to the system using FDTS-treated spacers, presumably due to the solution flow hindrance caused by the repulsion of FDTS-treated spacer. This implies that the mobility improvement arises from the cooperation between capillary action and gravity. Further tilting in excess of 12.5° results in mobility degradation, probably due to solution leakage as the angle becomes larger. This degradation is more pronounced for the system with FDTS-treated spacers, as no TFT characteristics could be observed for devices on the system tilted beyond 15°.

To further reveal the cooperation of capillary action and gravity, four different combinations of surface treatments to four pairs of spacers were designed, and the mobility dependence on the distance relative to the treated spacers was investigated. All devices prepared from PCDTPT have the same S-D orientation as the nano-grooves on the substrate, and all the sandwich systems used were tilted at a constant 12.5°. As shown in FIG. 6D, whether the treated spacers were placed high or low in the tilted systems, higher mobility results come from the devices closer to PTS-treated spacers, as opposed to the devices closer to FDTS-treated spacers, implying that the capillarity-induced mobility improvement becomes more evident when approaching the PTS-treated spacer. The devices close to the low-lying spacer outperform those approaching the high-lying spacer, when the same treatment is applied to the pair of spacers, as shown for PTS-PTS and FDTS-FDTS in the inset of FIG. 6D. These findings demonstrate that capillary action coupled with gravity induce a preferable solution flow toward the spacer, and consequently strengthens the unidirectional self-assembly and alignment along the uniaxial nano-grooves on the textured substrate during solution drying.

The mobility values in FIG. 5 assume that there is no contact resistance. The contact resistance has been measured by fabricating a series of TFTs with different channel lengths (FIG. 5A). By extrapolating the measured S-D channel resistance as a function of the channel length, the contact resistance $R_c=4.92\times10^4\Omega$ for PCDTPT was obtained. FIG. 5B shows the ratio of contact resistance over the total S-D channel resistance as a function of the channel length (L); the longer the channel, the less important is $R_c$. The transconductance curves for the TFTs fabricated with channel lengths of 80, 100 and 140 µm are shown in FIG. 5C. The highest measured mobility is $\mu_h=36.3$ $cm^2V^{-1}$ $s^{-1}$ obtained with L=140 µm. As shown in the inset, by extrapolating the data to 1/L→0, an estimate of the intrinsic mobility $\mu\approx47$ $cm^2V^{-1}$ $s^{-1}$ was obtained for PCDTPT (140 kDa). The next step is to significantly reduce the contact resistance so as to approach this high value.

Specific data from FETs fabricated with $M_n=50$ kDa are provided in Example 6. As shown in FIG. 14, mobility values of 52.7 $cm^2V^{-1}$ $s^{-1}$ were actually measured for channel length of 160 µm (averaged over eight independent devices with excellent reproducibility). By extrapolating the data to 1/L→0, an estimate of the intrinsic mobility, $\mu_h\approx71$ $cm^2V^{-1}$ $s^{-1}$ was obtained for PCDTPT ($M_n=50$ kDa).

This illustrative study has demonstrated a general and effective strategy to create unidirectional alignment and efficient charge transport for semiconducting polymer films deposited on textured $Si/SiO_2$ substrates. By employing sandwich casting in a tilted tunnel system, capillary action generated by the functionalized spacer is effectively utilized to render self-assembly of the semiconducting polymer along the uniaxial nano-grooves on the substrate. The strength of capillary action can be readily tailored by different surface treatments and functionalizations over the glass spacers. Charge transport in the polymer films prepared by this method is sensitive to the strength of capillary action induced by the functionalized spacers. The capillary action from PTS functionalization enables the achievement of highly oriented crystalline films with a compact lamella structure, leading to the superior saturation hole mobilities of 25.4 $cm^2V^{-1}$ $s^{-1}$ and 22.2 $cm^2V^{-1}$ $s^{-1}$ at L=80 µm for the two semiconducting polymers, PCDTPT and CDTBTZ, respectively. These values are limited by the S-D contact resistance, $R_c$. Measurements were carried out for longer channel lengths, L=100, 120, and 140 µm, where the contact resistance is less important compared to the channel resistance. For L=140 µm, $\mu_h=36.3$ $cm^2V^{-1}$ $s^{-1}$ was obtained for PCDTPT ($M_n=140$ kDa). Extrapolating to infinite channel length where $R_c$ unimportant compared to the actual channel resistance, the intrinsic mobility $\mu_h\approx47$ $cm^2V^{-1}$ $s^{-1}$ was obtained for PCDTPT ($M_n=140$ kDa) at this degree of chain alignment and structural order. The charge transport in the aligned films exhibits strong anisotropy, showing 13.6 and 17.6-fold higher mobility along the direction of alignment than perpendicular to the alignment for the two polymers, respectively. This methodology may be applied to a board range of semiconducting polymers. The concept of capillarity-mediated self-assembly and alignment opens up the possibility of enhancing anisotropic charge transport to create high mobility solution processable TFTs for low-cost organic electronics.

Example 6

Methods and Materials

Sample Preparation

The two semiconducting polymers, PCDTPT and CDT-BTZ, were synthesized using the reported chemical routes [13, 27]. The polymer solutions (0.25 mg ml$^{-1}$) were prepared in anhydrous chlorobenzene (99.8%, Sigma-Aldrich). The uniaxial nano-groove on the substrate were made by scratching the highly doped p$^+$-silicon wafer coated with 300 nm thermal silicon oxide (University Wafer) on diamond lapping film with nanoparticles of size 100 nm (3M). Subsequently, the source-drain electrodes consisting of Ni (5 nm)/Au (50 nm) for bottom-gate, bottom-contact transistors were accurately patterned on the scratched silicon wafers using photolithography and electron-beam deposition. The channel length was varied from 80 μm to 140 μm and the channel width was held constant at 1 mm. The electrode-deposited substrates were cleaned and functionalized by DTS using previously reported recipes [19]. The tunnel system was held and constructed with the assistance of small magnets (see FIG. 6). The comprised silicon substrates and glass spacers, from silicon wafer and glass slide (plain micro slide, 0215 glass from Corning), were precisely cut by advanced dicing saw (ADT 7100) into the specific sizes of 12.2×7.7×0.5 mm and 7.7×2.0×1.0 mm, respectively. Glass spacers and capillary tubes (soda-lime glass, Fisher Scientific) were cleaned in piranha solution (7:3 v/v $H_2SO_4$/30% $H_2O_2$) at 80° C. for 20 min, followed by rinsing with copious deionized water and drying in an oven at 110° C. for 20 min. DTS and PTS treatments over cleaned glass spacers and capillary tubes were then carried out by immersion in 1% toluene solution of DTS and PTS (DTS and PTS were purchased from Gelest) at 80° C. for 25 min, respectively, whereas FDTS treatment was performed through molecular vapour deposition using an automatic vacuum coater (MVD 100E, Applied Microstructures). Polymer solution (75 μL) was injected into the tunnel and dried in a $N_2$ glove box ($H_2O$, $O_2$<10 ppm) overnight.

Surface Morphology and X-Ray Characterizations

Surface topography images were obtained by AFM tapping mode using an Asylum MFP-3D system. To detach the polymer film and flip it over for AFM study of the bottom-side morphology, the substrate deposited with polymer film on thermal silicon dioxide was immersed into HF (hydrofluoric acid, 15%) for 5 min to obtain exfoliation of polymer sheets (Caution: HF is a hazardous, corrosive acid that demands rigorous safety considerations in its use and handling). Another native silicon substrate was used to press, adhere and capture the floating sheets, followed by careful rinsing with deionized water. X-ray scattering was carried out at the Stanford Synchrotron Radiation Lightsource on beamline 11-3 using an incident X-ray wavelength of 0.9752 Å with a 400 mm sample to detector distance. The measurements calibrated by a LaB6 standard were performed in a He environment to minimize air scattering. The samples for X-ray measurement were prepared using the sandwich casting with the same processing as for the TFT device, except the substrates without electrodes deposited were used.

Electrical Characterization

The substrate with dried polymer film was first annealed at 200° C. for 8 min. The electrical measurements were performed at a probe station with a drain-source voltage of −80 V using a Keithley 4200 semiconductor parameter analyser. Both the annealing and measurement were done in an $N_2$ glove box. TFT mobility was derived from the saturated operation regime by using the formula:

$$I_{DS}=(W/2L)C\mu_h(V_{GS}-V_{TH})^2$$

where W/L is the channel width/length, C is the capacitance of dielectric layer per unit area were measured for the native substrate and the substrate with nano-grooves (10.0 nF cm$^{-2}$ and 11.5 nF cm$^{-2}$), respectively. $V_{GS}$ and $V_{TH}$ are the gate-source voltage and the threshold voltage, respectively. To reduce any parasitic effects, prior to each measurement, the polymer surrounding the specific TFT was removed.

Detailed Construction of the Sandwich Tunnel Structure

The polymer film was cast by slow drying of polymer solution in a sandwich tunnel structure consisting of two SiO$_2$/Si substrates separated by two glass spacers inserted at both short sides.

Figure 6A:
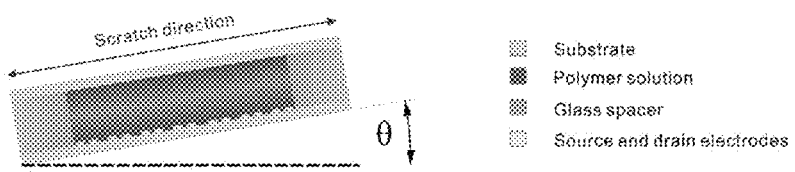
FIGS. 6A-D show the effect of tilting the tunnel system and the dependence of mobility on the distance relative to spacers, in accordance with one or more embodiments of the present invention.
Figure 6B:
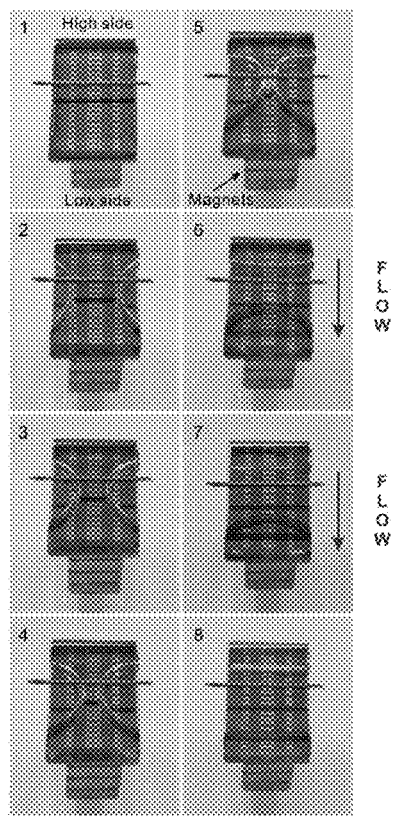
Figure 6C:
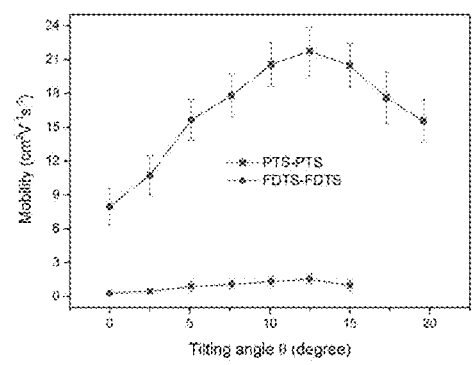
Figure 6D:
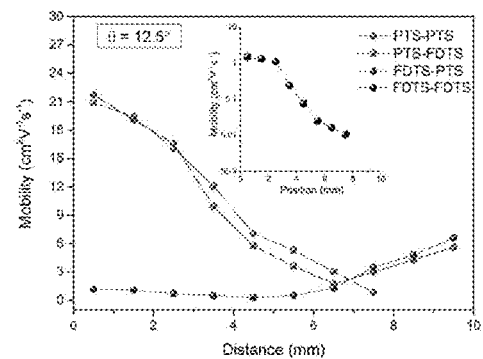

To eliminate the solution leakage issue, slices of magnets were placed above the top substrate and below the bottom substrate to hold the sandwich system, as shown in FIGS. 6A and 6B. Magnets of smaller size were used in the system to avoid the direct contact between substrate edge and magnet edge. The exact dimensions are 9.5×4.8×0.8 mm and 9.5×4.8×1.6 mm for the top and bottom magnets, respectively. The injected solution was well confined in the tunnel and no sign of solution leakage was spotted after drying.

REFERENCES

Note: This application references a number of different publications as indicated throughout the specification by one or more reference numbers within brackets, e.g., [x]. A list of these different publications ordered according to these reference numbers can be found below.

All publications, patents, and patent applications cited herein are hereby incorporated by reference in their entirety for all purposes (e.g. U.S. Patent Publication No. US 2012/0322966 and PCT Publication WO 2014/039847). Publications cited herein are cited for their disclosure prior to the filing date of the present application. Nothing here is to be construed as an admission that the inventors are not entitled to antedate the publications by virtue of an earlier priority date or prior date of invention. Further the actual publication dates may be different from those shown and require independent verification.

[1] Yan, H.; Chen, Z. H.; Zheng, Y.; Newman, C.; Quinn, J. R.; Dotz, F.; Kastler, M.; Facchetti, A. *Nature* 2009, 457, 679-686.

[2] Kim, B. G.; Jeong, E. J.; Chung, J. W.; Seo, S.; Koo, B.; Kim, J. S. *Nature Mater.* 2013, 12, 659-664.

[3] Yu, G.; Gao, J.; Hummelen, J. C.; Wudl, F.; Heeger, A. J. *Science* 1995, 270, 1789-1791.

[4] Park, S. H.; Roy, A.; Beaupre, S.; Cho, S.; Coates, N.; Moon, J. S.; Moses, D.; Leclerc, M.; Lee, K.; Heeger, A. J. *Nature Photon.* 2009, 3, 297-302.

[5] He, Z. C.; Zhong, C. M.; Su, S. J.; Xu, M.; Wu, H. B.; Cao, Y. *Nature Photon.* 2012, 6, 591-595.

[6] Burroughes, J. H.; Bradley, D. D. C.; Brown, A. R.; Marks, R. N.; Mackay, K.; Friend, R. H.; Burns, P. L.; Holmes, A. B. *Nature* 1990, 347, 539-541.

[7] Cao, Y.; Parker, I. D.; Yu, G.; Zhang, C.; Heeger, A. J. *Nature* 1999, 397, 414-417.

[8] Swager, T. *Nature Mater.* 2002, 1, 151-152.

[9] Pei, Q. B.; Yu, G.; Zhang, C.; Yang, Y.; Heeger, A. J. *Science* 1995, 269, 1086-1088.

[10] Fan, C. H.; Wang, S.; Hong, J. W.; Bazan, G. C.; Plaxco, K. W.; Heeger, A. J. *PNAS* 2003, 100, 6297-6301.

[11] Liang, Z.; Cabarcos, O. M.; Allara, D. L.; Wang, Q. *Adv. Mater.* 2004, 16, 823-827.
[12] Kline, R. J.; McGehee, M. D.; Toney, M. F. *Nature Mater.* 2006, 5, 222-228.
[13] Tsao, H. N.; Cho, D. M.; Park, I.; Hansen, M. R.; Mavrinskiy, A.; Yoon, D. Y.; Graf, R.; Pisula, W.; Spiess, H. W.; Mullen, K. *J. Am. Chem. Soc.* 2011, 133, 2605-2612.
[14] Padinger, F.; Brabec, C. J.; Fromherz, T.; Hummelen, J. C.; Sariciftci, N. S. *Opto-Electron. Rev.* 2000, 8, 280-283.
[15] Wang, S.; Kiersnowski, A.; Pisula, W.; Mullen, K. *J. Am. Chem. Soc.* 2012, 134, 4015-4018.
[16] O'Connor, B.; Kline, R. J.; Conrad, B. R.; Richter, L. J.; Gundlach, D.; Toney, M. F.; DeLongchamp, D. M. *Adv. Funct. Mater.* 2011, 21, 3697-3705.
[17] Cimrova, V.; Remmers, M.; Neher, D.; Wegner, G. *Adv. Mater.* 1996, 8, 146-149.
[18] Sirringhaus, H.; Wilson, R. J.; Friend, R. H.; Inbasekaran, M.; Wu, W.; Woo, E. P.; Grell, M.; Bradley, D. D. C. *Appl. Phys. Lett.* 2000, 77, 406-408.
[19] Tseng, H. R.; Ying, L.; Hsu, B. B. Y.; Perez, L. A.; Takacs, C. J.; Bazan, G. C.; Heeger, A. J. *Nano Lett.* 2012, 12, 6353-6357.
[20] Tseng, H. R.; Phan, H.; Luo, C.; Wang, M.; Perez, L. A.; Ying, L.; Kramer, E. J.; Nguyen, T.-Q.; Bazan, G. C.; Heeger, A. J. *Adv. Mater.* 2014, DOI: 10.1002/adma.201305084.
[21] Song, L.; Bly, R. K.; Wilson, J. N.; Bakbak, S.; Park, J. O.; Srinivasarao, M.; Bunz, U. H. F. *Adv. Mater.* 2004, 16, 115-118.
[22] Campoy-Quiles, M.; Ferenczi, T.; Agostinelli, T.; Etchegoin, P. G.; Kim, Y.; Anthopoulos, T. D.; Stavrinou, P. N.; Bradley, D. D. C.; Nelson, J. *Nature Mater.* 2008, 7, 158-164.
[23] Smith, J.; Hamilton, R.; McCulloch, I.; Stingelin-Stutzmann, N.; Heeney, M.; Bradley, D. D. C.; Anthopoulos, T. D. *J. Mater. Chem.* 2010, 20, 2562-2574.
[24] Luo, C.; Zuo, X. L.; Wang, L.; Wang, E. G.; Song, S. P.; Wang, J.; Wang, J.; Fan, C. H.; Cao, Y. *Nano Lett.* 2008, 8, 4454-4458.
[25] Luo, C.; Zheng, H.; Wang, L.; Fang, H. P.; Hu, J.; Fan, C. H.; Cao, Y.; Wang, J. A. *Angew. Chem. Int. Ed.* 2010, 49, 9145-9148.
[26] Janssen, D.; De Palma, R.; Verlaak, S.; Heremans, P.; Dehaen, W. *Thin Solid Films* 2006, 515, 1433-1438.
[27] Ying, L.; Hsu, B. B. Y.; Zhan, H. M.; Welch, G. C.; Zalar, P.; Perez, L. A.; Kramer, E. J.; Nguyen, T. Q.; Heeger, A. J.; Wong, W. Y.; Bazan, G. C. *J. Am. Chem. Soc.* 2011, 133, 18538-18541.
[28] Osaka, I.; Abe, T.; Shinamura, S.; Takimiya, K. *J. Am. Chem. Soc.* 2011, 133, 6852-6860.
[29] Rieger, R.; Beckmann, D.; Mavrinskiy, A.; Kastler, M.; Mullen, K. *Chem. Mater.* 2010, 22, 5314-5318.
[30] Wang, S. H.; Kappl, M.; Liebewirth, I.; Muller, M.; Kirchhoff, K.; Pisula, W.; Mullen, K. *Adv. Mater.* 2012, 24, 417-420.
[31] Feng, L.; Li, S. H.; Li, Y. S.; Li, H. J.; Zhang, L. J.; Zhai, J.; Song, Y. L.; Liu, B. Q.; Jiang, L.; Zhu, D. B. *Adv. Mater.* 2002, 14, 1857-1860.
[32] Niedzialek, D.; Lemaur, V.; Dudenko, D.; Shu, J.; Hansen, M. R.; Andreasen, J. W.; Pisula, W.; Mullen, K.; Cornil, J.; Beljonne, D. *Adv. Mater.* 2013, 25, 1939-1947.
[33] Sirringhaus, H.; Brown, P. J.; Friend, R. H.; Nielsen, M. M.; Bechgaard, K.; Langeveld-Voss, B. M. W.; Spiering, A. J. H.; Janssen, R. A. J.; Meijer, E. W.; Herwig, P.; de Leeuw, D. M. *Nature* 1999, 401, 685-688.
[34] Sirringhaus, H. *Adv. Mater.* 2014, 26, 1319-1335.
[35] Gleskova, H.; Hsu, P. I.; Xi, Z.; Sturm, J. C.; Suo, Z.; Wagner, S. J. *Non-Cryst. Solids* 2004, 338, 732-735.
[36] Nomura, K.; Ohta, H.; Takagi, A.; Kamiya, T.; Hirano, M.; Hosono, H. *Nature* 2004, 432, 488-492.
[37] Minemawari, H.; Yamada, T.; Matsui, H.; Tsutsumi, J.; Haas, S.; Chiba, R.; Kumai, R.; Hasegawa, T. *Nature* 2011, 475, 364-367.
[38] Giri, G.; Verploegen, E.; Mannsfeld, S. C. B.; Atahan-Evrenk, S.; Kim, D. H.; Lee, S. Y.; Becerril, H. A.; Aspuru-Guzik, A.; Toney, M. F.; Bao, Z. A. *Nature* 2011, 480, 504-508.
[39] Giri, G.; Park, S.; Vosgueritchian, V.; Shulaker, M. M.; Bao, Z. N. *Adv. Mater.* 2013, 26, 487-493.
[40] Yuan, Y. B.; Giri, G.; Ayzner, A. L.; Zoombelt, A. P.; Mannsfeld, S. C. B.; Chen, J. H.; Nordlund, D.; Toney, M. F.; Huang, J. S.; Bao, Z. N. *Nature Commun.* 2014, 5, Article number: 3005.
[41] Prakash, M.; Quere, D.; Bush, J. W. M. *Science* 2008, 320, 931-934.
[42] Gailberger et al., *Phys. Rev. B* 1991, 44, 8643-8651.
[43] Lunin A. F. et al., Mobility and concentration of current carriers in polymers with conjugate bonds. *Dokl. Akad. Nauk* 1972, 197, 1366-1369.
[44] Terao J., et al. *Nature Commun.* 2013, 4, 1691-1699.
[45] Kajiya et al., *Langmuir* 2008, 24, 12369-12374.
[46] Diao Y., et al. *Nature Mater.* 2013, 12, 665-671.
[47] Allard et al., *Angew. Chem. Int. Ed.* 2008, 47, 4070-4098.
[48] Diao et al., *Nat. Mater.* 2013, 12, (7), 7.
[49] Li et al., *Sci. Rep.* 2012, 2, 9.
[50] Guo et al., *Adv. Mater.* 2010, 22, (40), 4427-4447.
[51] Arias et al., *Chem. Rev.* 2010, 110, (1), 3-24.
[52] Sirringhaus, H. *Adv. Mater.* 2005, 17, (20), 2411-2425.
[53] McCulloch et al., *Nat. Mater.* 2006, 5, (4).
[54] Yan et al., *Nature* 2009, 457, (7230).
[55] Chen et al., *Adv Mater* 2012, 24(34), 4618-22.
[56] Osaka et al., *Acc. Chem. Res.* 2008, 41, 1202-1214.
[57] International Application No. PCT/US2013/058546

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A method of using capillary action to form a composition comprising a plurality of aligned polymer fibers, the method comprising:
depositing a solution comprising polymers onto a first substrate, wherein:
the first substrate comprises a first spacer; and
at least one surface of the first substrate and/or spacer has been treated so as to modulate the capillary action of the solution in contact with the first substrate and/or spacer;
allowing capillary action to modulate the flow of the solution contacting the first substrate and/or spacer; and
evaporating the solution, wherein the evaporation rate is controlled so as to be not more than 0.25 µL/min;
so that a composition comprising a plurality of aligned polymer fibers is formed.

2. The method of claim 1, wherein the first substrate comprises a second spacer and the method comprises disposing a second substrate on top of the first and second spacers so as to form a sandwich tunnel structure.

3. The method of claim 2, wherein:
a surface of the first and/or second substrate is treated so as to attract or repel the polymer solution; or
a surface of the first and/or second spacer is treated so as to attract or repel the polymer solution.

4. The method of claim 3, wherein a surface of the first and/or second substrate is treated by coating the surface with a silane composition.

5. The method of claim 3, wherein a surface of the first and/or second spacer is treated by coating the surface with a silane composition.

6. The method of claim 1, further comprising tilting the first substrate such that gravity modulates the flow of the solution.

7. The method of claim 6, wherein the first substrate is tilted at an angle not more than 15° from a level surface.

8. The method of claim 7, wherein the first substrate is tilted at an angle of 12.5° from a level surface.

9. The method of claim 6, wherein the method uses gravity to facilitate the flow of the solution towards a first spacer treated so as to attract the solution.

10. The method of claim 1, wherein:
the first substrate comprises a plurality of indentations that contact and align the plurality of polymer fibers; and
the plurality of indentations are disposed in a direction that is perpendicular to the first spacer.

11. The method of claim 1, wherein:
the polymer fibers are formed from conjugated polymers comprising a plurality of donor and acceptor units;
the conjugated polymers are disposed in the fibers such that longitudinal axes of the conjugated polymers within the polymer fibers are substantially aligned along longitudinal axes of the polymer fibers; and
the plurality of directionally aligned polymer fibers are adapted to transport charge between source and drain electrodes in a field effect transistor such that the field effect saturation mobility of the plurality of directionally aligned polymer fibers in the field effect transistor is at least 25 cm$^2$/Vs.

12. The method of claim 11, wherein the conjugated polymers comprise regioregular polymers having a regioregular conjugated main chain section, said regioregular conjugated main chain section having a repeat unit that comprises a pyridine of the structure:

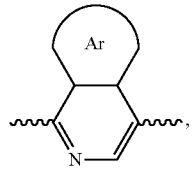

wherein Ar is a substituted or non-substituted aromatic functional group, or Ar is nothing and the valence of the pyridine ring is completed with hydrogen; and
the pyridine is regioregularly arranged along the conjugated main chain section.

13. The method of claim 11, wherein the conjugated polymers comprise a repeat unit of the following structure:

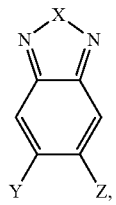

wherein X is O, S, Se, or N—R where R is H or a substituted or non-substituted alkyl, aryl or alkoxy chain; and Y, Z are independently selected to be H or F.

14. The method of claim 1, wherein the polymers comprise a fluorine atom.

15. The method of claim 14, wherein the polymers comprise poly[4-(4,4-dihexadecyl-4H-cyclopenta[1,2-b:5,4-b']dithiophen-2-yl)-6-fluorobenzo[c][1,2,5]thiadiazole] polymers.

16. A method of using capillary action to form a composition comprising a plurality of aligned polymer fibers, the method comprising:
depositing a solution comprising polymers onto a first substrate, wherein:
the first substrate comprises a first spacer; and
at least one surface of the first substrate and/or spacer has been treated so as to modulate the capillary action of the solution in contact with the first substrate and/or spacer;
allowing capillary action to modulate the flow of the solution contacting the first substrate and/or spacer; and
evaporating the solution, wherein the evaporation rate is controlled so as to be not more than 4×10$^{-3}$ μLmin$^{-1}$ mm$^{-2}$;
so that a composition comprising a plurality of aligned polymer fibers is formed.

17. The method of claim 16, wherein the polymers comprise a fluorine atom.

18. The method of claim 17, wherein the polymers comprise poly[4-(4,4-dihexadecyl-4H-cyclopenta[1,2-b:5,4-b']dithiophen-2-yl)-6-fluorobenzo[c][1,2,5]thiadiazole] polymers.

19. A method of using capillary action to form a composition comprising a plurality of aligned polymer fibers, the method comprising:
depositing a solution comprising polymers onto a first substrate, wherein:
the first substrate is tilted at an angle not more than 15° from a level surface;
the first substrate comprises a first spacer; and
at least one surface of the first substrate and/or spacer has been treated so as to modulate the capillary action of the solution in contact with the first substrate and/or spacer;
allowing capillary action to modulate the flow of the solution contacting the first substrate and/or spacer; and
evaporating the solution;
so that a composition comprising a plurality of aligned polymer fibers is formed.

20. The method of claim 19, wherein the polymers comprise a fluorine atom.

21. The method of claim 20, wherein the polymers comprise poly[4-(4,4-dihexadecyl-4H-cyclopenta[1,2-b:5,4-b']dithiophen-2-yl)-6-fluorobenzo[c][1,2,5]thiadiazole] polymers.

* * * * *